US012092791B2

(12) United States Patent
Kress et al.

(10) Patent No.: US 12,092,791 B2
(45) Date of Patent: Sep. 17, 2024

(54) OPTICAL METALENS SYSTEMS

(71) Applicant: Imagia, Inc., Las Vegas, NV (US)

(72) Inventors: Gregory Kress, San Francisco, CA (US); Abdoulaye Ndao, Brookline, MA (US); Arindom Datta, Fremont, CA (US)

(73) Assignee: Imagia, Inc., Las Vegas, NV (US)

( * ) Notice: Subject to any disclaimer, the term of this patent is extended or adjusted under 35 U.S.C. 154(b) by 89 days.

(21) Appl. No.: 17/682,085

(22) Filed: Feb. 28, 2022

(65) Prior Publication Data

US 2023/0075868 A1    Mar. 9, 2023

Related U.S. Application Data

(60) Provisional application No. 63/154,622, filed on Feb. 26, 2021.

(51) Int. Cl.
*G02B 1/00* (2006.01)
*C23C 16/24* (2006.01)
(Continued)

(52) U.S. Cl.
CPC ............. *G02B 1/002* (2013.01); *C23C 16/24* (2013.01); *C23C 16/56* (2013.01); *G02B 13/06* (2013.01); *G02B 27/0025* (2013.01); *G02B 27/1013* (2013.01); *G03F 7/168* (2013.01); *H04N 25/134* (2023.01); *G02B 3/0056* (2013.01); *G02B 2003/0093* (2013.01); *G02B 5/201* (2013.01); *G02B 2207/101* (2013.01)

(58) Field of Classification Search
None
See application file for complete search history.

(56) References Cited

U.S. PATENT DOCUMENTS 4,272,641 A    6/1981   Hanak
4,419,696 A    12/1983  Hamano
(Continued)

FOREIGN PATENT DOCUMENTS

EP    3872538 A2 *  9/2021   ............. G01B 11/24
KR    2143535 B1    8/2020
(Continued)

OTHER PUBLICATIONS

Hsu, et al., "Review of Metasurfaces and Metadevices: Advantages of Different Materials and Fabrications," Nanomaterials, Jun. 8, 2022, pp. 1-24.
(Continued)

*Primary Examiner* — James M Hannett
(74) *Attorney, Agent, or Firm* — PCFB, LLC; Justin K. Flanagan

(57) ABSTRACT

Various embodiments and configurations of optical imaging systems are described herein that utilize a metalens for narrowband deflection of target frequencies. For example, one embodiment of a multifrequency metalens includes an in-plane spatially multiplexed array of frequency-specific nanopillars or frequency-specific rows/columns of nanopillars that are intermingled with one another. In other embodiments, transmissive metalenses and/or reflective metalenses are tuned to focus color-separated visible light into red, green, and blue (RGB) channels of a digital image sensor.

17 Claims, 33 Drawing Sheets

(51) Int. Cl.
*C23C 16/56* (2006.01)
*G02B 13/06* (2006.01)
*G02B 27/00* (2006.01)
*G02B 27/10* (2006.01)
*G03F 7/16* (2006.01)
*H04N 25/13* (2023.01)
*G02B 3/00* (2006.01)
*G02B 5/20* (2006.01)

(56) References Cited

U.S. PATENT DOCUMENTS

| | | | |
|---|---|---|---|
| H873 H | 1/1991 | Cukauskas | |
| 5,578,517 A | 11/1996 | Yoo | |
| 6,322,942 B1 | 11/2001 | Chou | |
| 6,709,928 B1 | 3/2004 | Jenne | |
| 7,084,074 B1 | 8/2006 | D'Elia | |
| 10,750,145 B1 | 8/2020 | Shipton | |
| 11,747,446 B1 | 9/2023 | Uthoff | |
| 11,796,818 B2 * | 10/2023 | Lin | H04N 13/344 |
| 2007/0122077 A1 | 5/2007 | Bellman | |
| 2013/0316518 A1 | 11/2013 | Hollister | |
| 2019/0154877 A1 * | 5/2019 | Capasso | G02B 1/002 |
| 2019/0196068 A1 * | 6/2019 | Tsai | G02B 1/002 |
| 2019/0206722 A1 | 7/2019 | De Silva | |
| 2020/0096672 A1 * | 3/2020 | Yu | G02B 1/02 |
| 2020/0135703 A1 * | 4/2020 | Ahmed | G02B 30/00 |
| 2020/0225386 A1 * | 7/2020 | Tsai | G02B 1/002 |
| 2020/0264343 A1 | 8/2020 | Han | |
| 2021/0141146 A1 | 5/2021 | Melli | |
| 2021/0208312 A1 | 7/2021 | Zhang | |
| 2022/0137258 A1 * | 5/2022 | Bartlett | G02B 30/26 345/694 |
| 2023/0014285 A1 * | 1/2023 | Kante | G02B 27/0056 |
| 2023/0062193 A1 * | 3/2023 | Han | G02B 3/00 |
| 2023/0221462 A1 | 7/2023 | Sun | |
| 2023/0280499 A1 * | 9/2023 | Hao | G02B 1/002 359/642 |
| 2023/0384499 A1 | 11/2023 | Klug | |
| 2024/0008590 A1 | 3/2024 | Kress | |

FOREIGN PATENT DOCUMENTS

| | | | | |
|---|---|---|---|---|
| KR | 2262913 B1 | 6/2021 | | |
| KR | 102292826 B1 | 8/2021 | | |
| WO | WO-2016140720 A2 * | 9/2016 | | G02B 1/002 |
| WO | WO-2017176921 A1 * | 10/2017 | | G02B 1/00 |
| WO | 2020101568 A1 | 5/2020 | | |
| WO | WO-2022051971 A1 * | 3/2022 | | |
| WO | 2022183094 A1 | 9/2022 | | |
| WO | 2024059751 A2 | 3/2024 | | |

OTHER PUBLICATIONS

U.S. Appl. No. 18/467,583, Non-Final Office Action mailed Dec. 7, 2023, 17 pp.

PCT International Patent Application No. PCT/US2022/018083, International Search Report and Written Opinion mailed Jul. 26, 2022, 10 pp.

PCT International Patent Application PCT/US2023/074253, International Search Report and Written Opinion mailed Apr. 4, 2024, 14 pp.

* cited by examiner

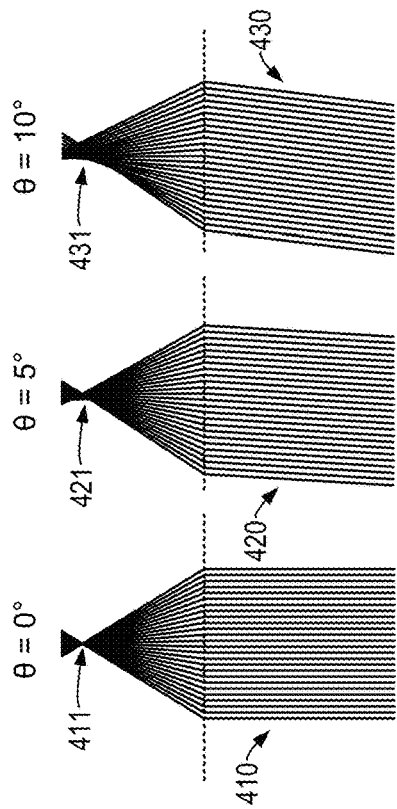
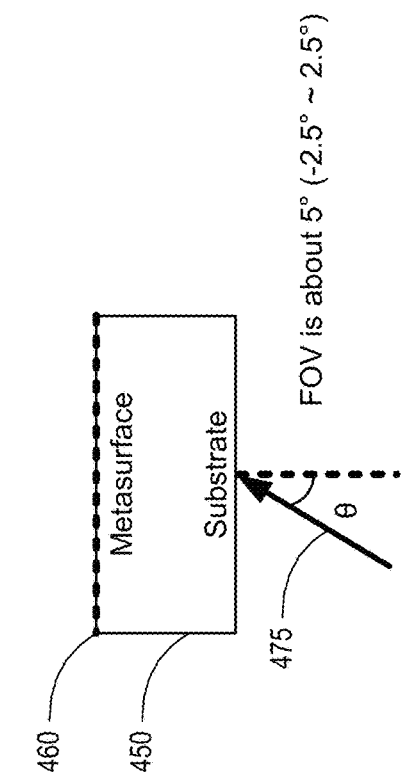
FIG. 4B
FIG. 4C
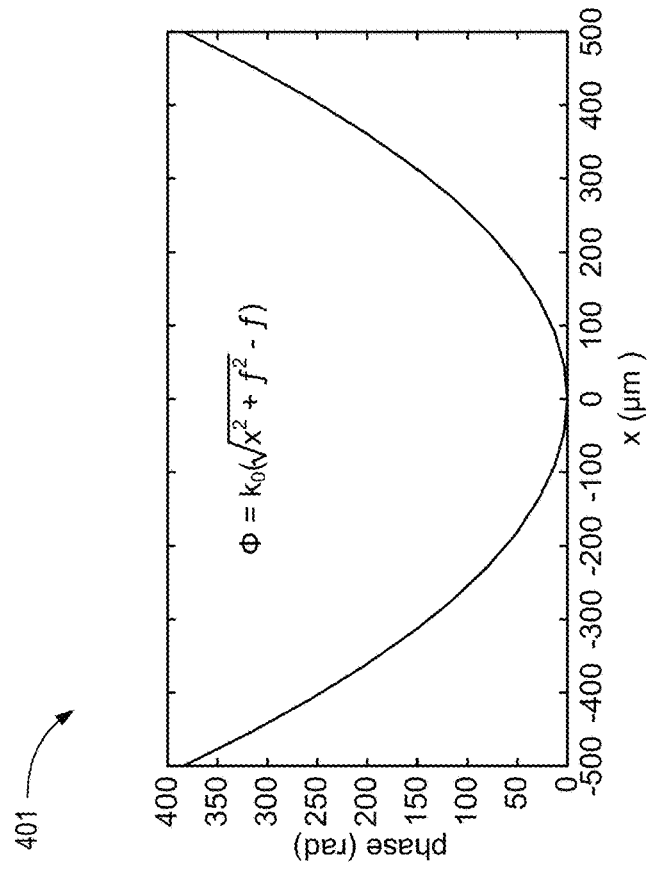
FIG. 4A

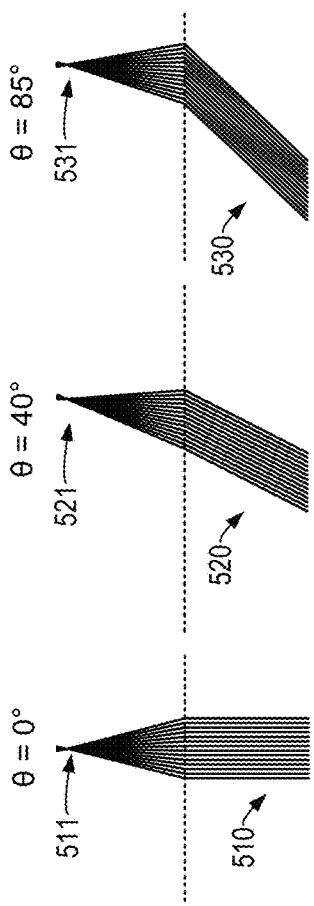
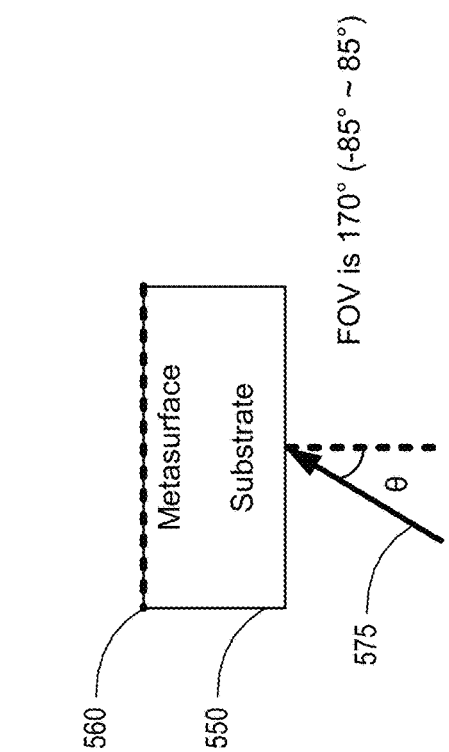
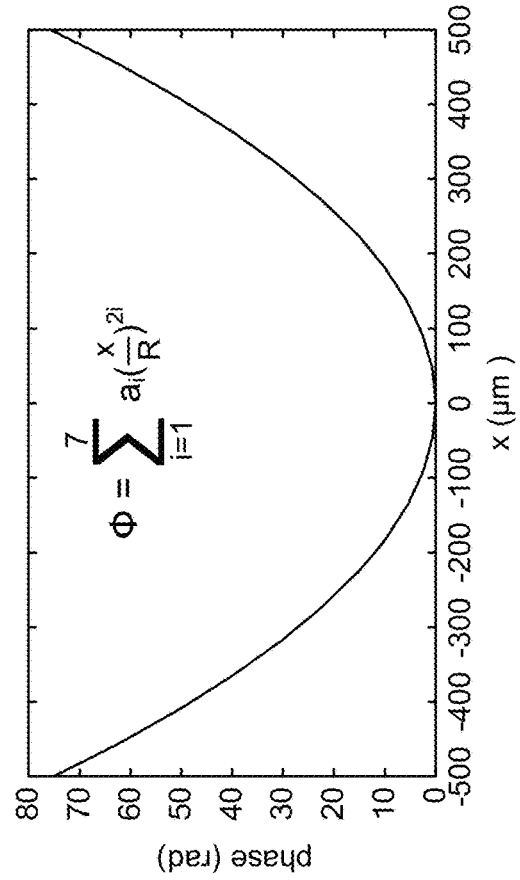
FIG. 5B
FIG. 5C
FIG. 5A

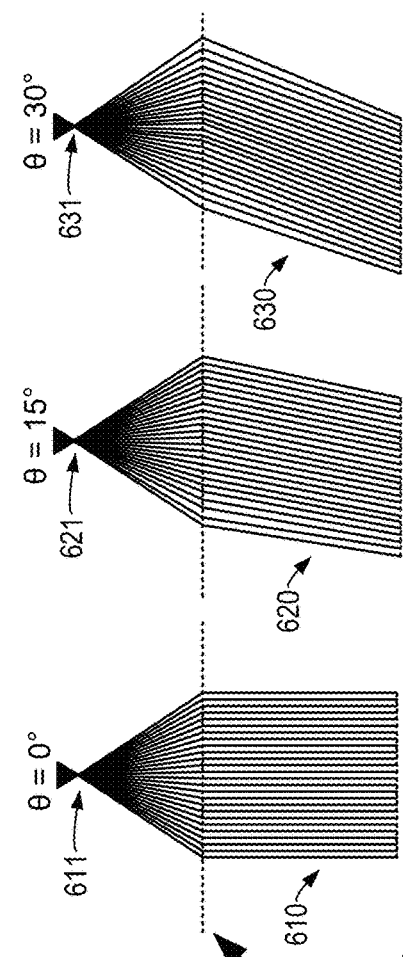
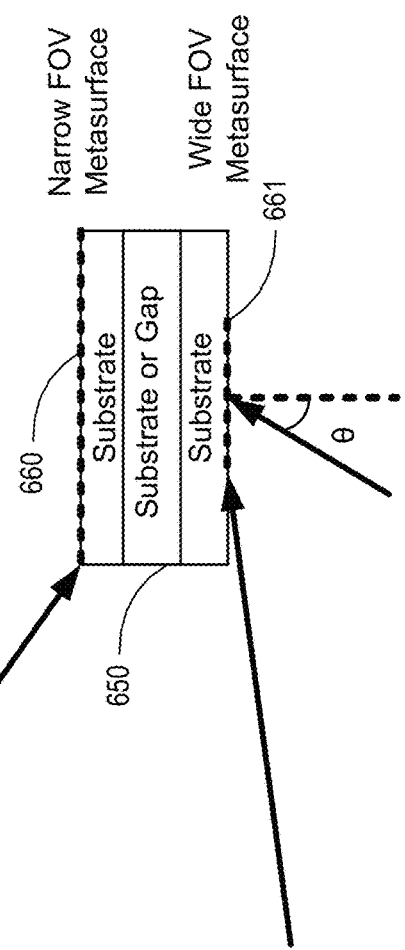
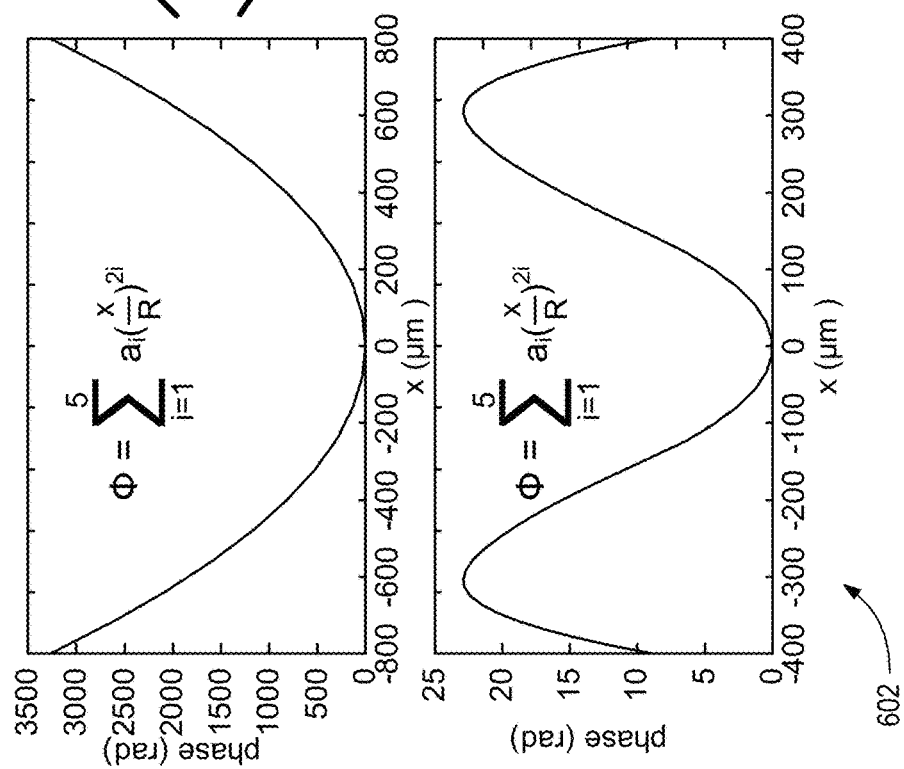
FIG. 6A
FIG. 6B
FIG. 6C

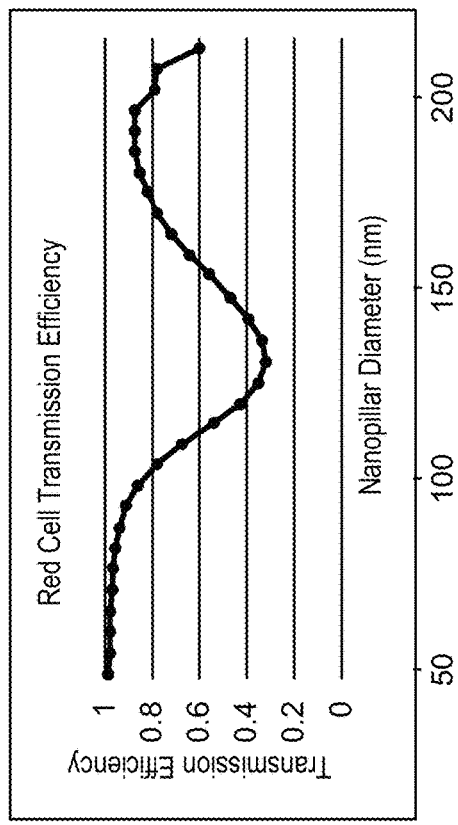
FIG. 17A
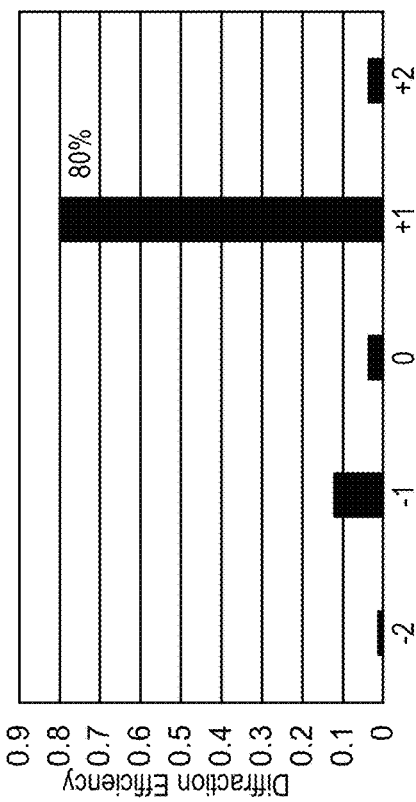
FIG. 17B
FIG. 17D
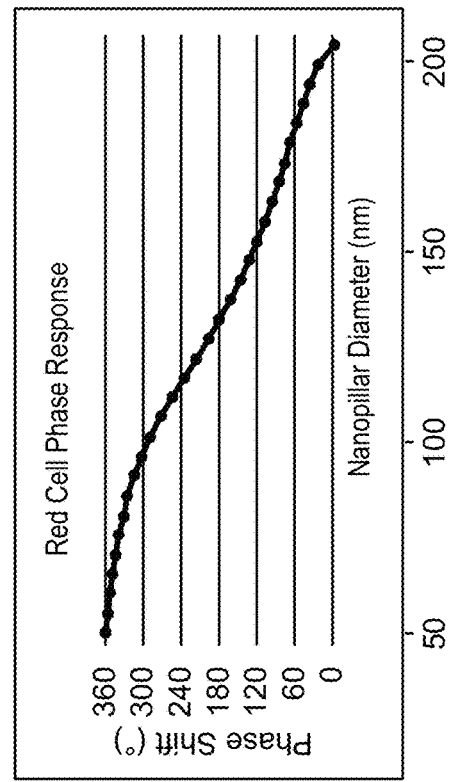
FIG. 17C

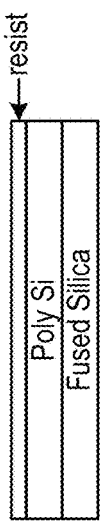
Fused Silica substrate
Cleaning
FIG. 20A
Poly Si Deposition (LPCVD) and Anneal
FIG. 20B
Poly Si / Fused Silica
Coat Negative Resist
FIG. 20C
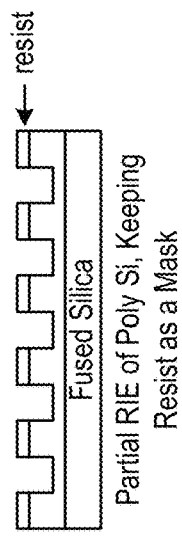
E-beam Lithography (EBL) & Develop
FIG. 20D
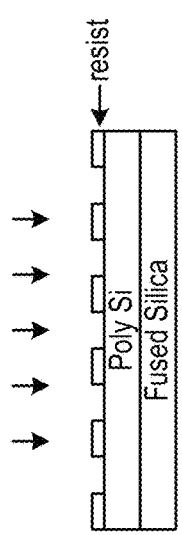
Partial RIE of Poly Si, Keeping Resist as a Mask
FIG. 20E
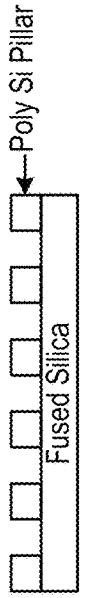
Strip resist hard mask in NMP and O2 Plasma post RIE
FIG. 20F
Short RIE Etch Back of Poly Si
FIG. 20G

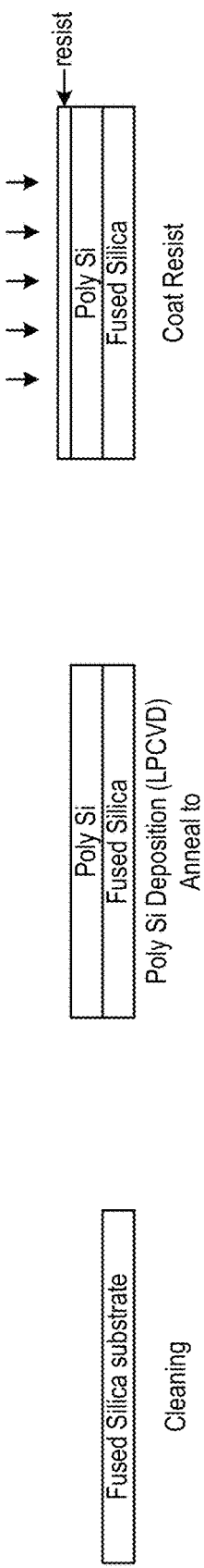
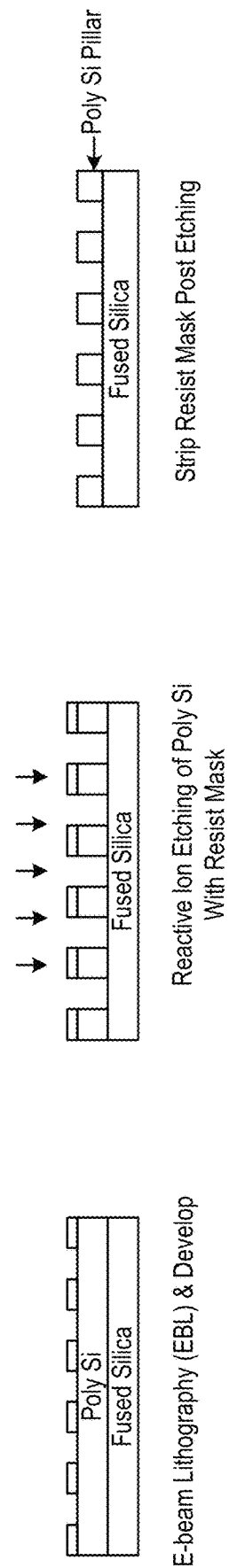
FIG. 21A Cleaning
FIG. 21B Poly Si Deposition (LPCVD) Anneal to
FIG. 21C Coat Resist
FIG. 21D E-beam Lithography (EBL) & Develop
FIG. 21E Reactive Ion Etching of Poly Si With Resist Mask
FIG. 21F Strip Resist Mask Post Etching Pixel Mapping

OPTICAL METALENS SYSTEMS

RELATED APPLICATIONS

This application claims priority to U.S. Provisional Patent Application No. 63/154,662, titled "Optical Metalens Systems," filed on Feb. 26, 2021, which is hereby incorporated by reference in its entirety.

BACKGROUND

This disclosure relates to metamaterial devices. More specifically, this disclosure relates to metalenses, imaging devices, optics, and satellites. Various approaches exist to control the deflection of incident optical radiation for image capture via digital image sensors. For example, reflective optical systems may reflect and focus incident optical radiation onto a digital image sensor. Alternatively, refractive optics that are optically transmissive may be utilized. A combination of optical elements may be utilized to refract, deflect, focus or otherwise modify optical radiation for incidence onto a digital image sensor.

Traditional optical lenses and mirrors (e.g., glass or acrylic lenses) are formed with a curvature to modify the optical path of incident optical radiation. Multiple lenses and/or mirrors may be combined with various indices of refraction, curvatures, coatings, and other features to perform specific optical functions. Traditional imaging systems, such as camera lenses, telescopes, and other digital imaging systems utilize lenses and/or mirrors to focus light onto a digital imaging sensor. Digital imaging sensors typically utilize a combination of color filters and microlenses to record images in an RGB or another multicolor pixel format.

FIG. 1A illustrates a block diagram of an optical path in a Keplerian refracting telescope 101, according to one embodiment. The Keplerian refracting telescope 101 includes multiple refracting lenses 110 and 112 that focus incident optical radiation (visible light) from a relatively large aperture onto a user's eye 114. Instead of direct observation, a digital image sensor, such as a CMOS or CCD sensor may be used to capture and record the images captured by the Keplerian refracting telescope 101.

FIG. 1B illustrates a block diagram of an optical path in a prime focus reflective telescope 102, according to one embodiment. As illustrated, incident light passes through the relatively large aperture and is incident on the reflective mirror 120. The reflective mirror 120 focuses parallel light paths to the same focus on the digital imaging sensor 125. The digital imaging sensor 125 may include multiple pixels (e.g., many megapixels) to capture high-resolution images of a distant object, as is understood by one of reasonable skill in the art. Image processing techniques, such as stacking or integration, may be utilized to increase the signal-to-noise ratio in a single image generated from a sequence of captured images of the same object.

Telescopes and other long-range optical imaging devices may be used on earth to capture images of objects in space, such as planetary and solar bodies. Telescopes traditionally include optical elements that are precision-ground, include many elements, and frequently employ special lens coatings and materials to refract or reflect a broad band of frequencies. Differences in the refraction angle of different frequencies or wavelengths of light can result in chromatic aberration and other image defects. Digital image sensors may be selected to capture images in a specific spectrum of light that includes, for example, visible light, infrared light, ultraviolet light spectrum, H-Alpha light, and/or combinations thereof.

Optical imaging of the earth can be done using satellites in orbit around Earth, high-altitude or space vehicles, and/or other types of aircraft and spacecraft. For example, a wide variety of commercial and military organizations utilize satellites with integrated or attached telescopes to capture digital images of the earth. High-resolution imaging of the earth via an orbiting satellite generally requires powerful optics with relatively large apertures that can collect and focus significant quantities of light. The focused light is recorded using a digital image sensor, such as a CMOS digital image sensor, a CCD digital image sensor, variations thereof, and/or the like.

Images captured by a digital image sensor may be communicated back to earth in real-time or stored in the orbiting satellite. Telescopes and other optical imaging systems that require high optical power can be large, difficult to move, require precision manufacturing and assembly, can be expensive to produce, and can be expensive to launch into orbit. Even for smaller satellites, sometimes referred to as "smallsats" or "cubesats," the optical elements of the imaging system, and the required space between the optical elements, are often among the largest and costliest components.

FIG. 1C is an image of a large observation satellite 103 with an optical imaging system 130 for imaging Earth while in orbit, according to one embodiment. As illustrated, most of the volume of the main body of this relatively large satellite 103 is part of the optical imaging system 130.

FIG. 2 is an image of a small observation satellite 204 with an optical imaging system 240 for imaging Earth while in orbit, according to one embodiment. Although the overall size of this example satellite is much smaller than the satellite illustrated in FIG. 1C, the optical elements of the optical imaging system 240 still constitute a large portion of the volume and weight of the satellite 204.

BRIEF DESCRIPTION OF THE DRAWINGS

FIG. 4A illustrates a graph of the phase response of a hyperbolic metalens relative to the distance from the center of the metalens, according to one embodiment.

FIG. 4B illustrates example ray paths focused by the hyperbolic metalens at different angles of incidence, according to one embodiment.

FIG. 4C illustrates a block diagram of the hyperbolic metalens with a relatively narrow field of view on a substrate, according to one embodiment.

FIG. 5A illustrates a graph of the phase response of a fisheye metalens relative to the distance from the center of the metalens, according to one embodiment.

FIG. 5B illustrates example ray paths focused by the fisheye metalens at different angles of incidence, according to one embodiment.

FIG. 5C illustrates a block diagram of the fisheye metalens with a relatively wide field of view on a substrate, according to one embodiment.

FIG. 6A illustrates graphs of the phase responses of each metalens in a double-let configuration relative to the distance from the center of each respective metalens, according to one embodiment.

FIG. 6B illustrates example ray paths focused by the double-let metalens at different angles of incidence, according to one embodiment.

FIG. 6C illustrates a block diagram of the double-let metalens with two metalenses on opposing surfaces of the substrate, according to one embodiment.

FIG. 17A illustrates an example unit cell of a red metalens subpixel, according to one embodiment.

FIG. 17B illustrates transmission values for various diameters of a cylindrical deflector element in a unit cell for the example red metalens subpixel of FIG. 17A, according to one embodiment.

FIG. 17C illustrates phase shift values for various diameters of a cylindrical deflector element in a unit cell for the example red metalens subpixel of FIG. 17A, according to one embodiment.

FIG. 17D illustrates the diffraction efficiency at various diffraction orders of the cylindrical deflector element in the unit cell for the example red metalens subpixel of FIG. 17A.

FIGS. 20A-20G illustrate an example process for fabricating a metalens with an array of passive deflector elements having varying diameters that extend from a substrate, according to one embodiment.

FIGS. 21A-21F illustrate an example process for fabricating a metalens with an array of passive deflector elements having varying diameters that extend from a substrate, according to one embodiment.

DETAILED DESCRIPTION

Figure 1A:
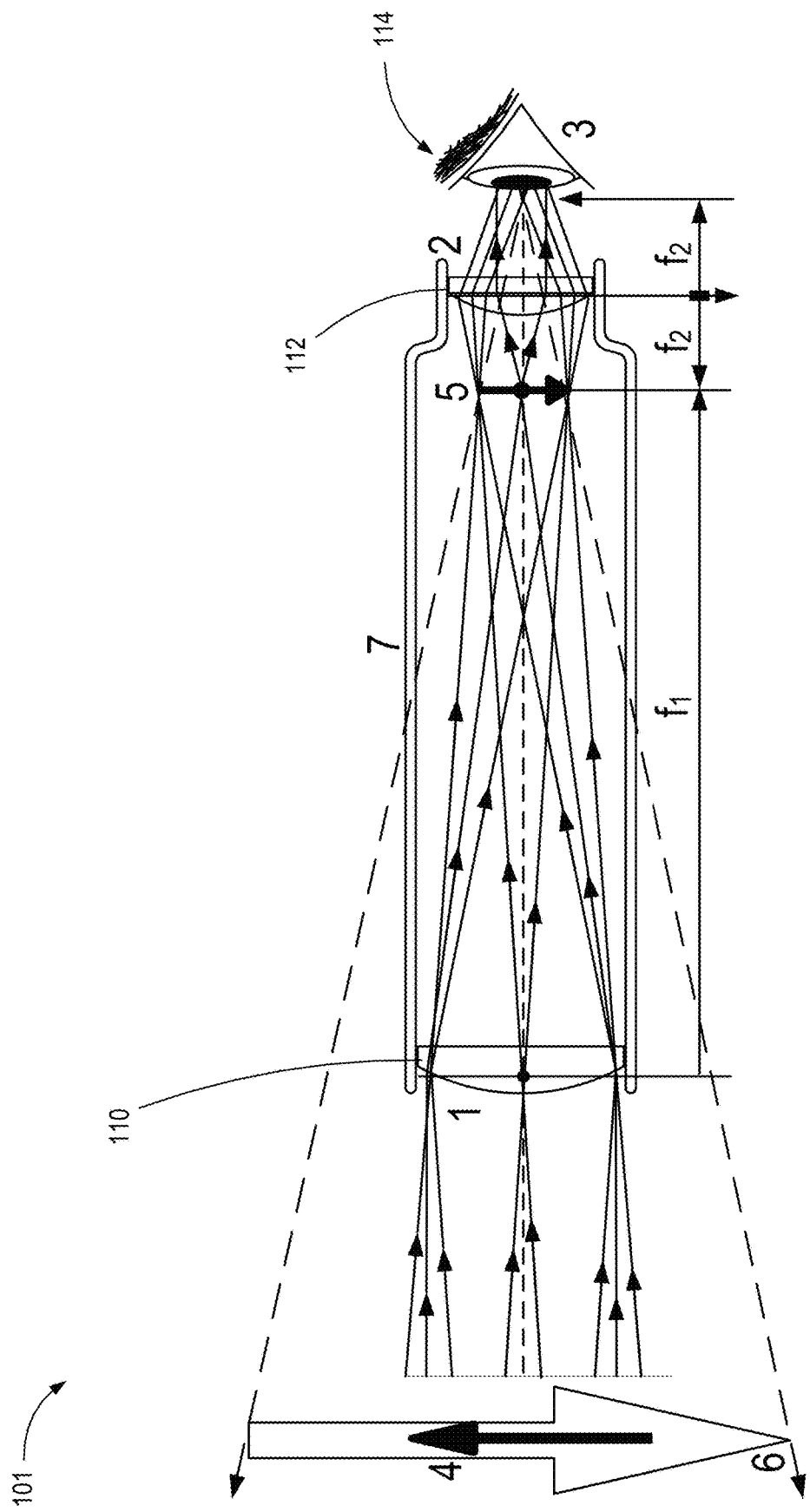
FIG. 1A illustrates an example diagram of an optical path in a Keplerian refracting telescope.
Figure 1B:
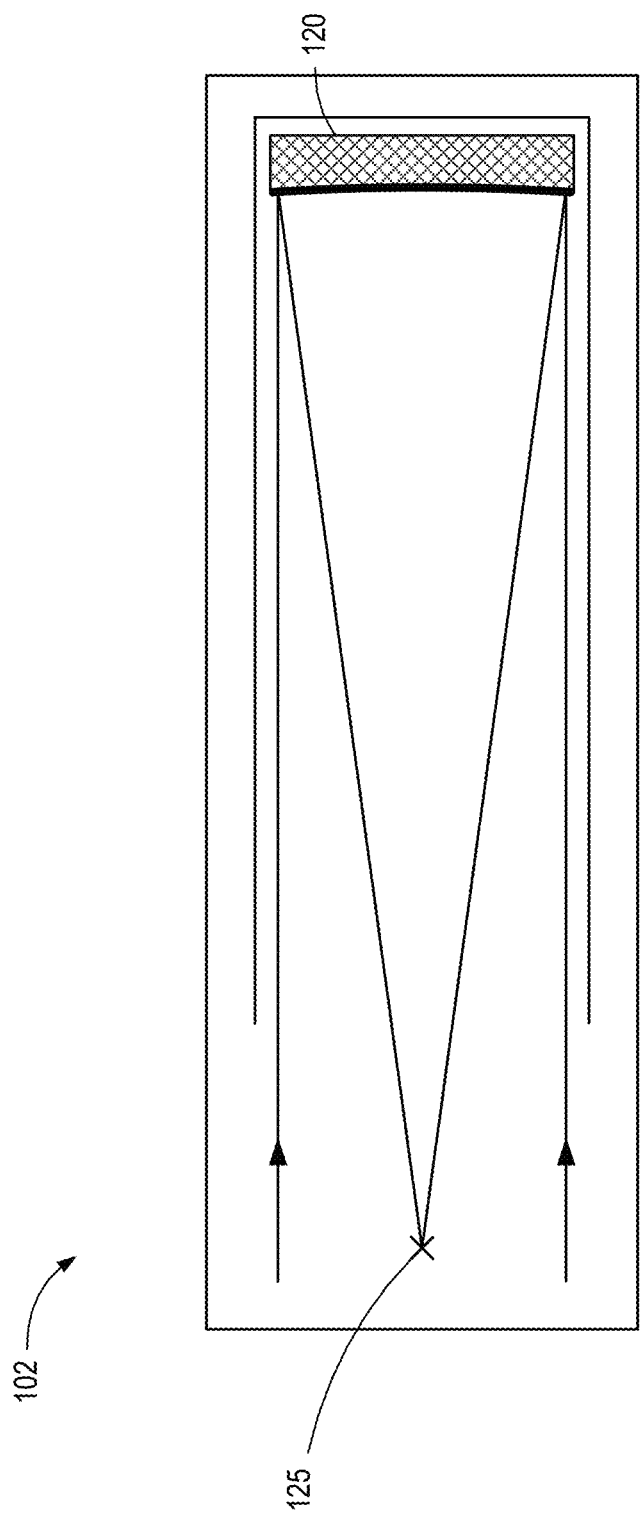
FIG. 1B illustrates an example diagram of an optical path in a prime focus reflective telescope.
Figure 1C:
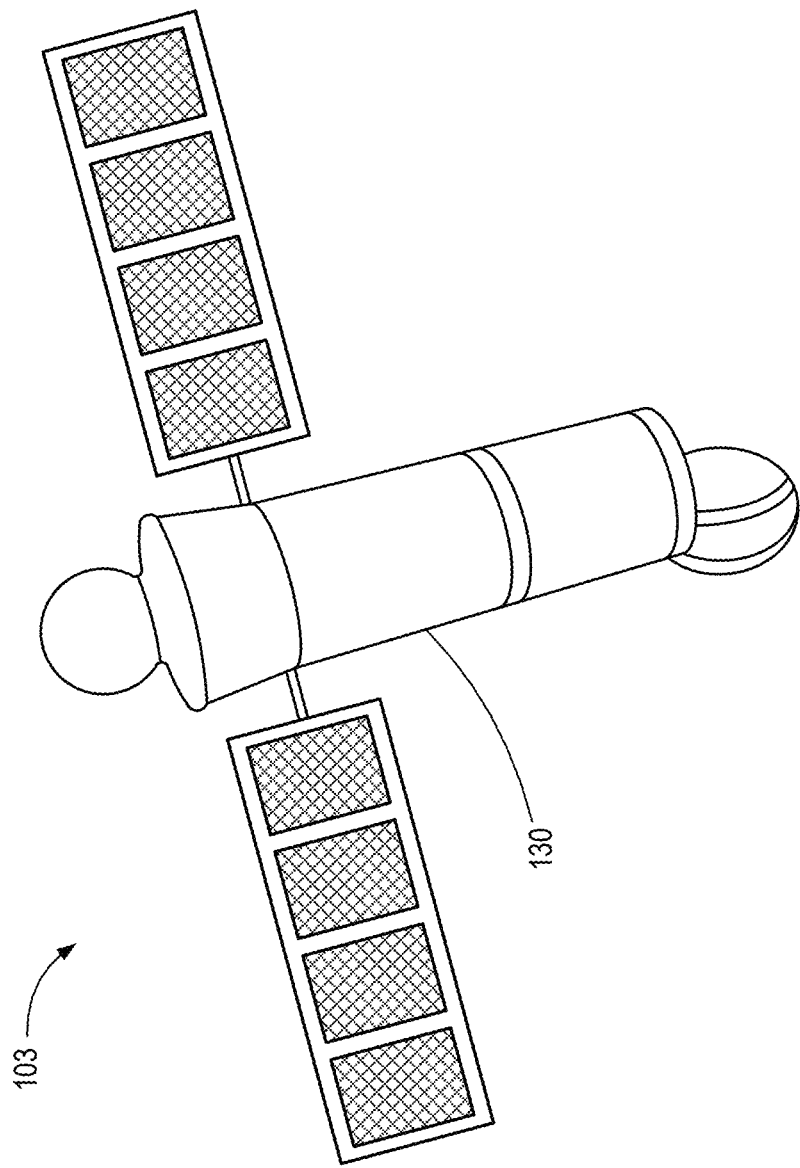
FIG. 1C is an example diagram of a large observation satellite with an optical system for imaging the earth.
Figure 2:
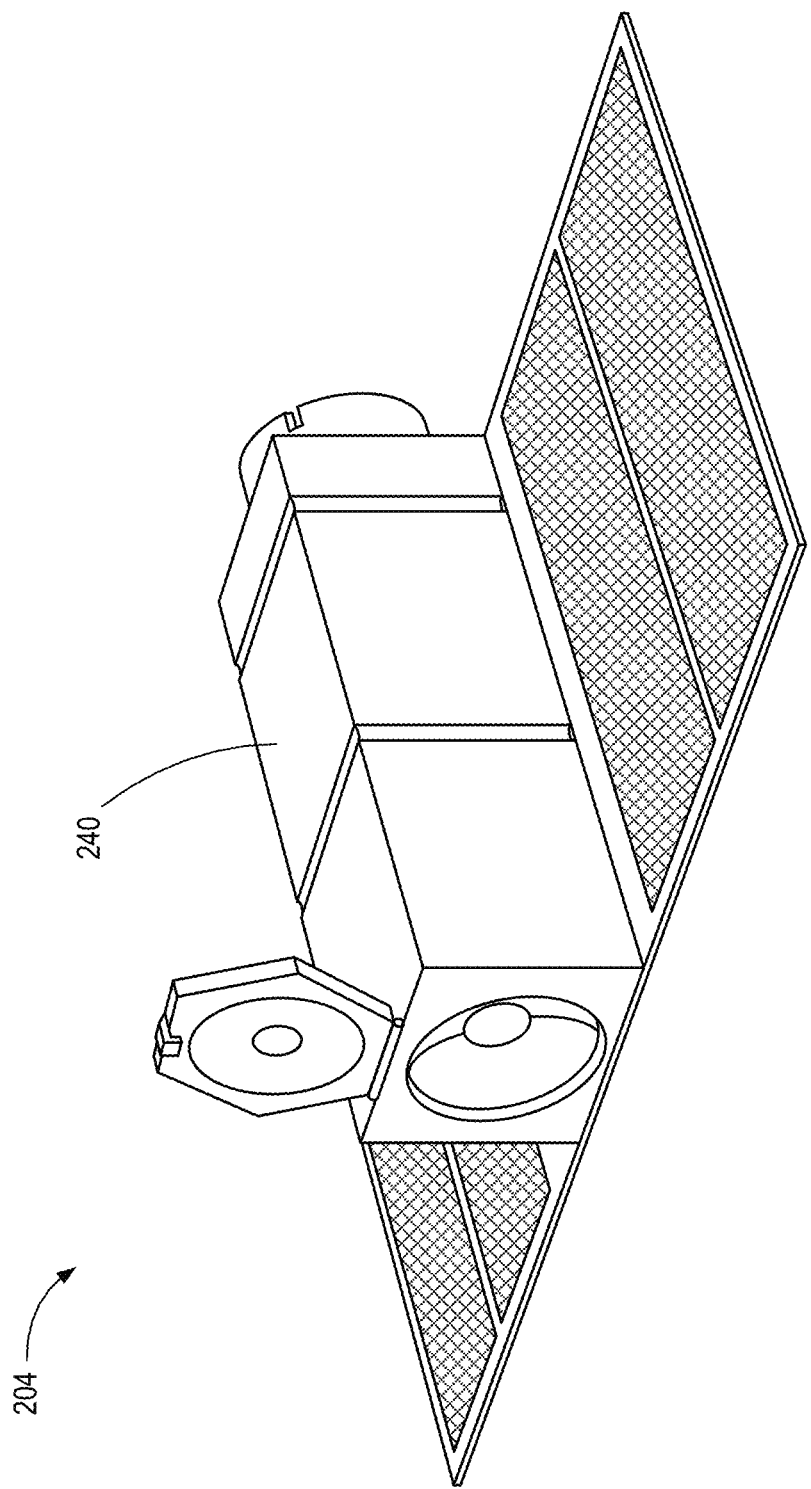
FIG. 2 is an example diagram of a small observation satellite with an optical system for imaging the earth, according to one embodiment.

According to various embodiments described herein, metalenses are used to collect and focus light onto a digital image sensor. Various metalens configurations are contemplated to provide a lighter, mechanically simpler, more durable, lower profile, shorter, smaller, and/or higher resolution optical path than possible using traditional optical elements. In some embodiments, one or more metalenses are used as refractive or diffractive optics to focus light from a large aperture (relative to the sensor size) onto a digital image sensor. In some embodiments, a reflective metalens is used to focus incident light from a large aperture onto a centered or offset digital image sensor. In some embodiments, a frequency-selective reflective metalens is used to reflect specific frequencies of incident light to color-specific digital image sensors, as described in greater detail below.

In still other embodiments, narrowband transmissive metalenses are used to selectively focus a specific frequency of light onto a digital image sensor while allowing other frequencies to pass through the metalens substantially unaltered. In some embodiments, narrowband reflective metalenses are used to selectively focus a specific frequency onto a digital image sensor while allowing other frequencies to pass through the metalens substantially unaltered.

Many of the embodiments described herein utilize a metalens. A metalens or metamaterial-based lens can be transmissive (analogous to a diffractive lens) or reflective (analogous to a reflective mirror). In many embodiments, a metalens can be formed as a three-dimensional metamaterial layer or object of relatively thin (e.g., <1 mm) elements that provide controlled deflection without curved surfaces. As described herein, a substrate surface may be configured as a transmissive surface to allow optical radiation to pass therethrough, or as a reflective surface to reflect optical radiation therefrom. Subwavelength-scale features may be patterned on a surface of the substrate to deflect incident optical radiation in a controlled manner to obtain a target optical radiation output at any angle or range of angles between 0° to 180°. The subwavelength-scale features may be configured to deflect incident optical radiation over a wide band of frequencies or a narrow band of frequencies.

In some embodiments, subwavelength-scale features may be formed on more than one surface of the substrate. For example, subwavelength-scale features may be formed on a receiving side of a transmissive substrate and an output side of the transmissive substrate. In various embodiments, a surface (or multiple surfaces) of the substrate is patterned with an array of deflector elements. According to various embodiments calculated, estimated, modeled, or optimized to achieve specific target deflection patterns (e.g., phase-shift based deflection patters), the array of deflector elements may be uniformly spaced, periodically spaced, aperiodically spaced, and/or arranged in repeating patterns of the same.

Each deflector element in the array of deflector elements may have subwavelength dimensions, such that the deflector element array collectively exhibits metamaterial behaviors for a relatively narrow band of optical radiation (e.g., a target operational bandwidth). In some embodiments, the deflector elements may extend substantially orthogonal to the planar surface of the substrate.

Efficient wave-front manipulation via a metalens is accomplished by achieving a $2\pi$ phase shift within the operational frequency band. A single resonant mode provides a $\pi$ phase sift. Accordingly, in some embodiments, a ground plane is used in combination with deflector elements to provide at least a $2\pi$ phase shift. In other embodiments, two resonant modes are overlapped with the same magnitude and phase to form a Huygens metasurface that provides a $2\pi$ phase shift.

In various embodiments, the contact surface of a deflector element contacting the substrate may be a circle, oval, square, rectangle, an n-sided polygon, or another shape, including freeform shapes. The deflector element may extend from the planar surface to a height that is greater than a length or width dimension of the deflector element. For example, each of the deflector elements may have a circular contact surface with a diameter less than the smallest wavelength within the operational bandwidth and extend from the substrate as a pillar to a height, H. In various embodiments, the height, H, may also be less than the smallest wavelength within the operational bandwidth.

In other embodiments, each deflector element may be a non-circular pillar extending from the substrate. For example, each deflector element may have a square, rectangular, oval, hexagonal, or other shape profile and extend from the substrate to a predetermined height. In some embodiments, each of the deflector elements in a deflector element array may extend to the same height. In other embodiments, the heights of various deflector elements may vary randomly, form a slope relative to the planar surface of the substrate, and/or conform to a repeating pattern.

In some embodiments, each deflector element may be a pillar (e.g., a circular or non-circular pillar) formed from titanium dioxide, polycrystalline silicon nanopillars, and/or silicon nitride that extends from a silicon dioxide substrate or magnesium fluoride substrate. Such pillars, including both circular and non-circular variations, may be referred to as nanopillars due to their subwavelength characteristics. In some embodiments, the substrate may comprise multiple layers of substrates with different refractive indices and/or comprise different combinations of materials. For example, in some embodiments, the substrate may comprise a Bragg reflector formed as a sequence of layers of two or more different optical materials having different refractive indices. In various embodiments, the deflector elements are passive subwavelength deflectors that are polarization independent.

The deflection pattern (transmissive or reflective) generated by the metalens may be influenced or controlled by the deliberate selection of pillar height, diameter, spacing, and pattern arrangement on the substrate. Metalenses may have a deflector element array configured to generate a converging deflection pattern to focus incident optical radiation (e.g., infrared light, visible light, ultraviolet light, etc.) on a digital image sensor. The optical radiation is phase-shifted as it is reflected or otherwise deflected by the metasurface.

In some embodiments, a metalens includes an array of passive, polarization-independent deflector elements extending from a transmissive substrate. In some embodiments, a single metalens may be responsive to multiple colors or a wideband of optical radiation (e.g., by intermingling deflector elements of varying sizes and patterns on the substrate). A multicolor or wideband metalens may be used to focus incident light onto a multicolor digital image sensor, such as an RGB digital image sensor with red, green, and blue subpixels forming each pixel.

In some embodiments, narrowband metalenses may be used to form a Bayer-type filter layer to selectively transmit a narrow band of wavelengths to a digital imaging sensor. For example, metalenses configured to pass through red, green, and blue wavelengths may be arranged in a Bayer filter mosaic or another three-color filter array. A red subpixel of a digital imaging sensor may be associated with a single metalens that passes a narrow band of optical radiation centered around, for example, 650 nanometers. A green subpixel of a digital imaging sensor may be associated with a single metalens that passes a narrow band of optical radiation centered around, for example, 535 nanometers. A blue subpixel of a digital imaging sensor may be associated with a single metalens that passes a narrow band of optical radiation centered around, for example, 490 nanometers.

In other embodiments, to increase the bandwidth of light received for each subpixel, multiple metalenses having slightly different tuning frequencies may be used for each subpixel. For instance, each subpixel of the digital imaging sensor (e.g., each red subpixel, each blue subpixel, and each green subpixel) may be associated with multiple metalenses that are subpixel in size. Each subpixel metalens may be configured to pass a narrow band of optical radiation centered around slightly different frequencies of the color of the underlying subpixel of the digital imaging sensor.

For example, a red subpixel of the digital imaging sensor may be associated with two different subpixel metalenses, one of which passes a narrow band of red light centered at 645 nanometers and one of which passes a narrow band of red light centered at 655 nanometers. As another example, an array of 16 subpixel metalenses may be associated with a red subpixel of a digital imaging sensor. Each subpixel metalens in the array of subpixel metalens may pass a narrowband of "red" light centered at a slightly different wavelength ranging from, for example, 630 nanometers to 670 nanometers. Each of the green and blue subpixels of the digital imaging sensor can likewise be associated with an array of subpixel metalenses tuned to slightly different frequencies to provide a wider band of transmission than is possible using a single, tuned metalens.

According to various embodiments, metalenses may be fabricated using nanoimprinting manufacturing techniques, using CMOS-compatible materials as part of a CMOS manufacturing approach, using ultraviolet lithography techniques, using electron beam lithography (EBL), combinations thereof, and other related manufacturing techniques for micro- and nano-device manufacturing. Relatively low aspect ratios (e.g., the ratio of the height to the width of each nanopillar deflector element) allow for relatively faster, cheaper, and higher fidelity manufacturing than competing technologies. For example, the array of nanopillar deflector elements and the underlying substrate may use resonant modes that are electromagnetically coupled to form a metalens that is ultrathin (e.g., less than one wavelength).

As described herein, metalenses may be configured to transfer a high percentage of received optical radiation as deflected optical radiation according to a target deflection pattern with a thickness much smaller than would be possible using traditional optical elements. The corresponding weight savings over traditional glass optical elements in a telescope are significant. The metalens-based digital imaging devices (e.g., telescopes) described herein provide performance, cost, and durability advantages when used in orbiting satellites for imaging Earth as compared to traditional glass optical elements.

In various embodiments, an array of polarization-independent, passive deflector elements patterned on a transmissive or reflective substrate may be adapted to deflect a relatively narrow band of optical radiation in a prescribed direction, arbitrarily based on the origin of the optical radiation (e.g., pixel-by-pixel variation), and/or collimated to provide an effective "infinite focus." In some embodiments, an array of polarization-dependent, passive deflector elements may be patterned on a transmissive or reflective substrate for use with a relatively wide band of noncoherent optical radiation in a prescribed direction, arbitrarily based on the origin of the optical radiation (e.g., pixel-by-pixel variation), and/or collimated to provide an effective "infinite focus."

As described herein, an array of nanopillar deflector elements may have a repeating pattern of pillars with varying diameters, interelement spacings, and/or heights. The repeating pattern of nanopillar deflector elements may be repeated multiple times to provide a metasurface lens with a target surface area (e.g., a circular shape defining the aperture of the optical imaging device. The diameters, interelement spacings, and/or heights of the pillars in each array of nanopillar deflector elements may vary based on the frequency or frequencies to be deflected, as well as the target angle of deflection, to the digital image sensor or sensors.

In one embodiment, a multifrequency metalens for a multicolor imaging system includes an in-plane spatially multiplexed array of frequency-specific nanopillars or frequency-specific rows/columns of nanopillars that are intermingled with one another. According to such embodiments, the metalens may, for example, be used with an RGB digital image sensor for imaging Earth, a two-color digital image sensor (e.g., blue and H-Alpha) for imaging celestial bodies, or another multicolor digital image sensor. For instance, the spatially multiplexed array of frequency-specific nanopillars may comprise a plurality of sub-unit-cells with a number of pillars equal to or greater than the number of independent frequencies to be deflected (e.g., RGB) The periodicity of the sub-unit-cells is subwavelength and selected for zero-order diffraction. Accordingly, the periodicity of the sub-unit-cells may be selected to be less than the smallest wavelength of the frequencies to be deflected. For example, if the smallest wavelength to be deflected is 550 nanometers, the largest periodicity for zero-order diffraction is approximately 360 nanometers, and so the largest periodicity of the sub-unit-cells is approximately 180 nanometers (e.g., the Nyquist limit). For blue light with a wavelength less than 500 nanometers, the largest periodicity for zero-order diffraction would be even smaller, and accordingly, the largest periodicity of the sub-unit-cells would be smaller still.

In some embodiments, to achieve an acceptable phase shift of each of the independent frequencies to be deflected (e.g., a range from 0 to $2\pi$), the height of the individual pillars may be slightly taller than in other embodiments to accommodate for relatively close spacing defined by the calculated largest possible periodicity of the sub-unit-cells for zero-order diffraction. For example, a pillar height between approximately 200 nanometers and 400 nanometers may be suitable, depending on the specific frequencies to be deflected. In one specific example, the individual pillars have a height of approximately 300 nanometers. In one embodiment, the individual pillars have heights of 220 nanometers, while in another embodiment the individual pillars have heights of 230 nanometers.

For a selected height and periodicity, a simulator or calculation module may simulate or calculate the transmission and transmitted phase shift of each of the frequencies to be deflected for a range of pillar diameters in each sub-unit-cell. Suitable pillar diameters may be selected to achieve target performance metrics and/or controllability. For example, pillar diameters may be selected to provide a transmission of at least 0.7 (e.g., 70%) and a phase shift within a range of 0 to 27 to provide full control of deflection. In some embodiments and applications, lower or higher transmission thresholds may be acceptable and/or partial deflection control may be sufficient (e.g., less than 27 phase shift).

The difference between the target field and the simulated field provides a figure of merit that can be calculated as $|t_{target} e^{-i\Phi_{target}} - t_j e^{-i\Phi_j}|^2$. An optimization algorithm, such as a global optimization algorithm, may be used to determine specific radius (diameter) dimensions for the pillars in each sub-unit cell. A metalens is formed via a repeating pattern of sub-unit-cells with pillars that have varying diameters.

Many traditional telescopes for digital imaging include circular optical elements that focus incident optical radiation onto a rectangular digital image sensor. The rectangular sensor effectively "crops" out a portion of the circular focused incident optical radiation on the sensor plane. The presently described metalenses can be formed as straight rows and columns of pillars to form a thin, circular disk analogous to a traditional circular lens that focuses incident optical radiation onto a rectangular digital image sensor. In other embodiments, a metalens can be formed as concentric circles of pillars to form a thin, circular disk analogous to a traditional circular lens that focuses incident optical radiation onto a rectangular digital image sensor.

In other embodiments, the metalens can be formed as straight rows and columns of pillars to form a rectangular metalens that focuses incident optical radiation onto a corresponding rectangular digital image sensor. For a given aperture surface area, the rectangular metalens provides a very efficient mapping of incident light onto the rectangular digital image sensor. For example, all the light incident on a rectangular metalens can be mapped to a rectangular digital image sensor with the same aspect ratio. In contrast, a traditional, glass circular lens can, at best, map about 63% of the incident light onto a square digital image sensor. As illustrated by the foregoing, 37% or more of the volume of a traditional cylindrical optical lens for a telescope is wasted due to the mismatch between the circular lenses and the rectangular digital image sensor.

The generalized descriptions of the systems and methods herein may be utilized and/or adapted for utilization in a wide variety of industrial, commercial, and personal applications. Similarly, the presently described systems and methods may be used in conjunction with or utilize existing computing devices, image processing techniques, stitching, composite photography, high-dynamic-range (HDR) bracketing, and the like. Some of the infrastructure that can be used with embodiments disclosed herein is already available, such as general-purpose computers, computer programming tools and techniques, digital storage media, rockets to launch satellites equipped with telescopes and other digital imaging devices, communication links, and the like. A computing device or controller may include a processor, such as a microprocessor, a microcontroller, logic circuitry, or the like.

A processor or controller may include one or more special-purpose processing devices, such as application-specific integrated circuits (ASICs), a programmable array logic (PAL), a programmable logic array (PLA), a programmable logic device (PLD), a field-programmable gate array (FPGA), or another customizable and/or programmable device. The computing device may also include a machine-readable storage device, such as non-volatile memory, static RAM, dynamic RAM, ROM, CD-ROM, disk, tape, magnetic, optical, flash memory, or another machine-readable storage medium. Various aspects of certain embodiments may be implemented using hardware, software, firmware, or a combination thereof.

The components of the disclosed embodiments, as generally described and illustrated in the figures herein, could be arranged and designed in a wide variety of different configurations. Furthermore, the features, structures, and operations associated with one embodiment may be applied to or combined with the features, structures, or operations described in conjunction with another embodiment. In many instances, well-known structures, materials, or operations are not shown or described in detail to avoid obscuring aspects of this disclosure. The embodiments of the systems and methods provided within this disclosure are not intended to limit the scope of the disclosure but are merely representative of possible embodiments. In addition, the steps of a method do not necessarily need to be executed in any specific order or even sequentially, nor do the steps need to be executed only once.

Figure 3:
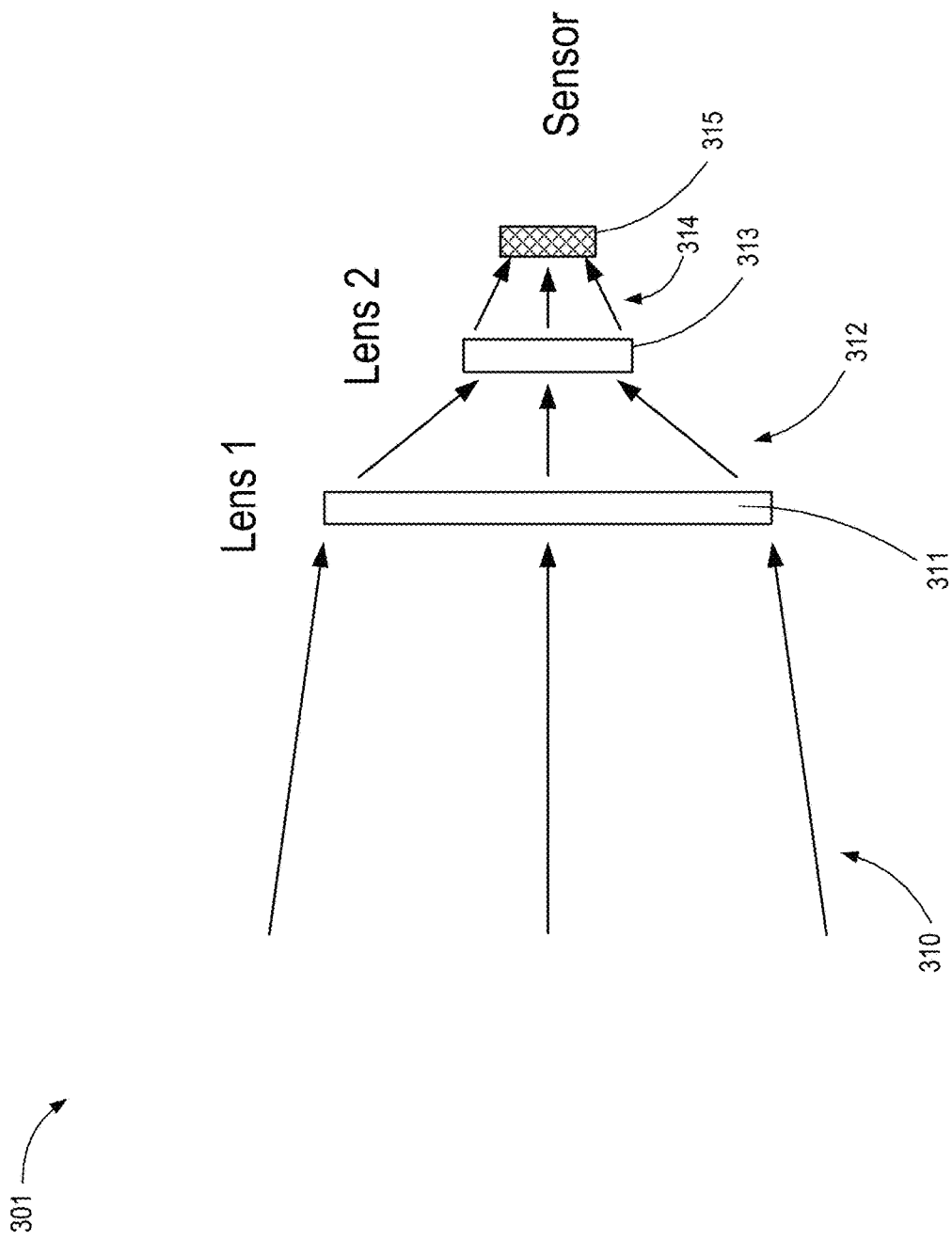
FIG. 3 illustrates a block diagram of an optical path of a refractive-type imaging system that includes two metamaterial lenses and a digital image sensor, according to one embodiment.

FIG. 3 illustrates a block diagram of an optical path of a diffractive-type or refractive-type imaging system 301 that includes two metamaterial lenses (metalenses) 311 and 313 and a digital image sensor 315, according to one embodiment. As illustrated, incident light 310 is deflected by the first metalens 311. The deflected light 312 is received by the second metalens 313 and further deflected as focused light 314 onto the image sensor 315. Each of the metalenses 311 and 313 may be embodied according to any of the various embodiments described herein.

As previously noted, metalenses can be configured with patterns of pillars to implement the equivalent optical function of a traditional lens and/or mirror with a much lower weight and profile (e.g., <1 mm thick). Metalenses also allow for shorter inter-lens spacing and reduced the overall volume of the imaging system without degrading optical performance.

FIG. 4A illustrates a graph 401 of the phase response of a hyperbolic metalens relative to the distance from the center of the metalens, according to one embodiment. As illustrated, the phase response ranges from approximately 0 radians at the center to nearly 400 radians at the edges. As described herein, a metalens can be formed as a plurality of nanopillars with diameters, spacings, heights, and diameter patterns selected to achieve a target deflection (e.g., refraction, diffraction, or reflection) pattern. Specific details and examples of metalenses are described in various publications, including U.S. Patent Publication No. 2021/0405255 titled "Optical Metalenses," which publication is hereby incorporated by reference in its entirety.

FIG. 4B illustrates example ray paths focused by the hyperbolic metalens at different angles of incidence, according to one embodiment. As illustrated, the hyperbolic metalens is highly selective, to the extent that optical radiation 410 incident at 0 degrees is focused to a point 411. However, optical radiation 420 incident on the hyperbolic metalens at even 5 degrees results in a relatively large spot size 421. Optical radiation 430 incident at 10 degrees results in an even large disbursement of the spot size 431.

FIG. 4C illustrates a block diagram of the hyperbolic metalens that includes substrate 450 with a metasurface 460 formed thereon, according to one embodiment. As illustrated, the field of view is only about 5 degrees with the acceptance angle 475 limited to between −2.5 degrees and 2.5 degrees. As previously described, for optical bandwidths, the metasurface 460 may comprise a plurality of pillars or nanopillars of varying diameters, patterns of diameters, heights, and subwavelength on-center spacings calculated to attain the hyperbolic phase response illustrated in FIG. 4A.

FIG. 5A illustrates a graph 501 of the phase response of a fisheye metalens relative to the distance from the center of the metalens, according to one embodiment. As illustrated, the phase response ranges from approximately 0 radians at the center to 80 radians at the edges. The fisheye metalens, like the other metalenses described herein, can be formed as a plurality of nanopillars with diameters, spacings, heights, and diameter patterns selected to achieve a target deflection (e.g., diffraction, refraction, or reflection) pattern.

FIG. 5B illustrates example ray paths focused by the fisheye metalens at different angles of incidence, according to one embodiment. As illustrated, the hyperbolic metalens has a wide field of view. Optical radiation 510 received at 0 degrees is focused to a point 511, just as optical radiation 520 received at 40 degrees and optical radiation 530 received at 85 degrees is focused to points 521 and 531.

FIG. 5C illustrates a block diagram of the fisheye metalens formed as a metasurface 560 on a substrate 550, according to one embodiment. Again, the fisheye metalens has a wide field of view of approximately 170 degrees with an acceptance angle 575 ranging from −85 degrees and 85 degrees. Again, for optical bandwidths, the metasurface 560 may comprise a plurality of pillars or nanopillars of varying diameters, patterns of diameters, heights, and subwavelength on-center spacings calculated to attain the fisheye phase response illustrated in FIG. 5A.

FIG. 6A illustrates graphs 601 and 602 of the phase responses of each metalens in a double-let configuration, according to one embodiment. The phase responses are shown with respect to the distance from the center of each respective metalens, according to one embodiment. The phase response in graph 610 ranges from approximately 0 radians at the center to 3500 radians at the edges. In contrast, the phase response of the other metalens, as shown in graph 602, ranges from 0 radians to approximately 10 radians at the edges, and with peak phase responses of approximately 23 radians about three-fourths of the distance between the center of the metalens to the edge of the metalens.

FIG. 6B illustrates example ray paths focused by the double-let metalens at different angles of incidence, according to one embodiment. As illustrated, optical radiation 610, 620, and 630 received at 0 degrees, 15 degrees, and 30 degrees, respectively, is focused to points 611, 621, and 631.

FIG. 6C illustrates a block diagram of the double-let metalens with a first metalens 661 with a wide field of view to deflect light toward a second metalens 660 with a narrower field of view. The metalenses 661 and 660 operate in conjunction to preserve the angle of incidence information for focusing on a sensor plane for imaging. The narrow field of view metalens 660 serves as a corrector layer or corrector lens that decreases the acceptance angle and reduces the spot size of the double-let metalens. Again, for optical bandwidths, the metasurfaces 660 and 661 each comprise a plurality of pillars or nanopillars of varying diameters, patterns of diameters, heights, and subwavelength on-center spacings calculated to attain the two different phase responses shown in the graphs 601 and 602 of FIG. 6A.

The metasurface 660 may be formed on a first substrate and the metasurface 661 may be formed on a different substrate. The two metasurfaces 660 and 661 may be physically separated by a gap at location 650. Alternatively, the two metasurfaces 660 and 661 or may be formed as a single device on the same base substrate. In such an embodiment, a suitably optically transparent bulk material may be used at location 650 to physically connect and space the metasurfaces 660 and 661 (an interlayer), for example a CMOS compatible dielectric material of constant thickness.

The metalenses 660 and 661 each include a plurality of pillars or nanopillars, as described herein. The high refractive index contrast between the nanopillars and their surroundings leads to a weak optical coupling among the nanopillars. According to various embodiments, the diameters of the nanopillars are spatially varied to implement a target phase profile with subwavelength resolution. Local and simultaneous control of the slope and intercept of the phase shift for a broadband response is attained via the spatially varied nanopillars of different diameters. The combination of metalens 660 and metalens 661 provides a two-layer metalens system that simultaneously corrects chromatic and geometric aberrations for broad spectral bandwidth and angular response.

The optimization of the two layers is performed simultaneously with the phase profile output of the first layer (the interlayer phase profile) used as the input phase profile to the second layer. With this approach, the first layer can be used to modify the slope and intercept phase information of light from a wide viewing angle and broad frequency range to within a smaller angular range that is capable of being sufficiently focused by the second layer. The angular information (necessary for imaging) is preserved by defining the phase profiles as even ordered polynomials of the radial coordinate "r" using Equation 1 below:

$$\Phi(r) = \sum_{i=1}^{n} a_n \left(\frac{r}{R}\right)^{2i} \quad \text{Equation 1}$$

In Equation 1, R is the radius of the metasurface, and the coefficients were optimized to minimize the spot size (root mean square) at the design field of view. 2i is used to force the function to be an even function of the radius, so that the solution is symmetric to the radius. Again, an optimization algorithm may be used to determine specific radius (diameter) dimensions for the pillars in each sub-unit cell. Each metalens may then be formed via a repeating pattern of sub-unit-cells with pillars that have varying diameters as calculated via the optimization process.

According to the embodiments described herein, the two-layer metalens or double-let metalens system depicted and described in conjunction with FIGS. 6A-6C preserves the angle of incidence information via chromatically and geometrically corrected focusing of incident optical radiation on a focus plane (e.g., on a digital imaging sensor).

According to various embodiments, a double-let metalens may be packaged as part of a CubeSat or other small optical imaging satellite. For example, the double-let metalens may be embodied as a rectangular metalens paired with a rectangular optical imaging sensor. The double-let metalens may have dimensions of approximately 10 centimeters on each side and provide a spectral operational bandwidth between 400 nanometers and 1,000 nanometers. In some embodiments, to satisfy the imaging requirements of a given satellite, fisheye metalenses and/or hyperbolic metalenses may be used instead of or in conjunction with double-let metalenses.

Figure 7A:
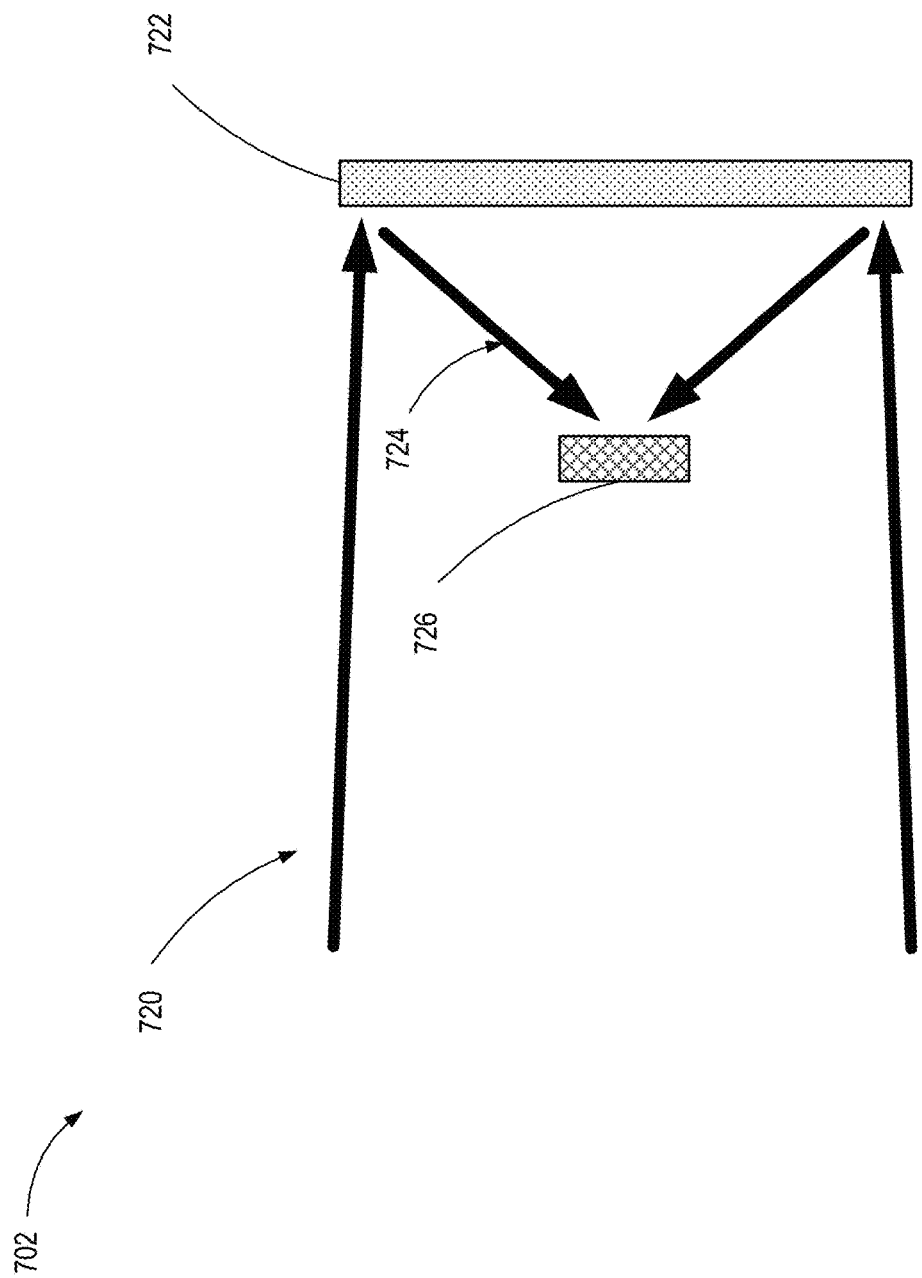
FIG. 7A illustrates a block diagram of an optical path of a reflective-type imaging system that includes a single metamaterial lens and a digital image sensor, according to one embodiment.

FIG. 7A illustrates a block diagram of an optical path of a reflective-type imaging system 702 that includes a single reflective metalens 722 and a digital image sensor 726 centered in the optical path. While the digital image sensor 726 blocks some of the incident light, it is acceptable in many situations since the relative size of the digital image sensor 726 is very small compared to the effective aperture of the reflective metalens 722. As illustrated, incident optical radiation 720 is reflected by the metalens 722 a focused optical radiation 724 onto the plane of the digital image sensor 726.

Figure 7B:
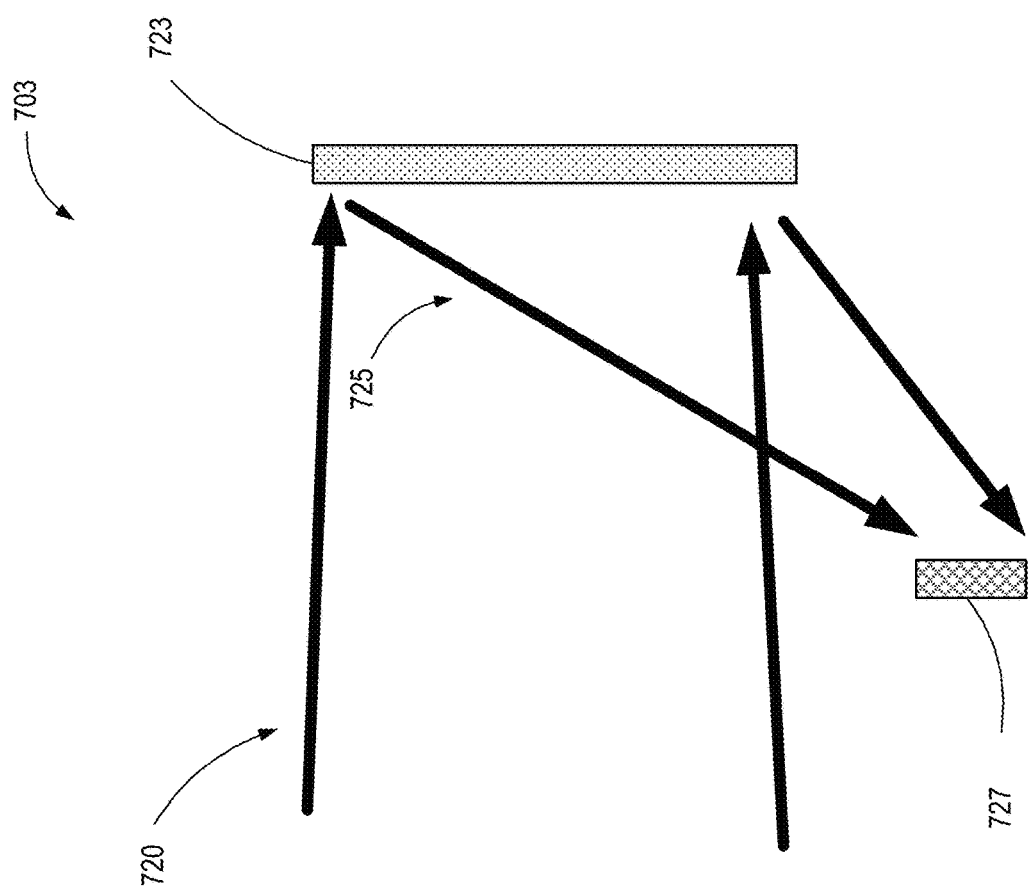
FIG. 7B illustrates a block diagram of an optical path of a reflective-type imaging system that includes a single metamaterial lens and an offset digital image sensor, according to one embodiment.

FIG. 7B illustrates a block diagram of an optical path of a reflective-type imaging system 703 that includes a single metamaterial lens 723 and an offset digital image sensor 727, according to one embodiment. In the illustrated embodiment, the offset digital image sensor 727 does not block the aperture of the digital imaging systems for most practical fields of view. The incident optical radiation 720 is reflected by the metalens 723 as focused optical radiation 725 that is received by the digital image sensor 727.

Figure 8:
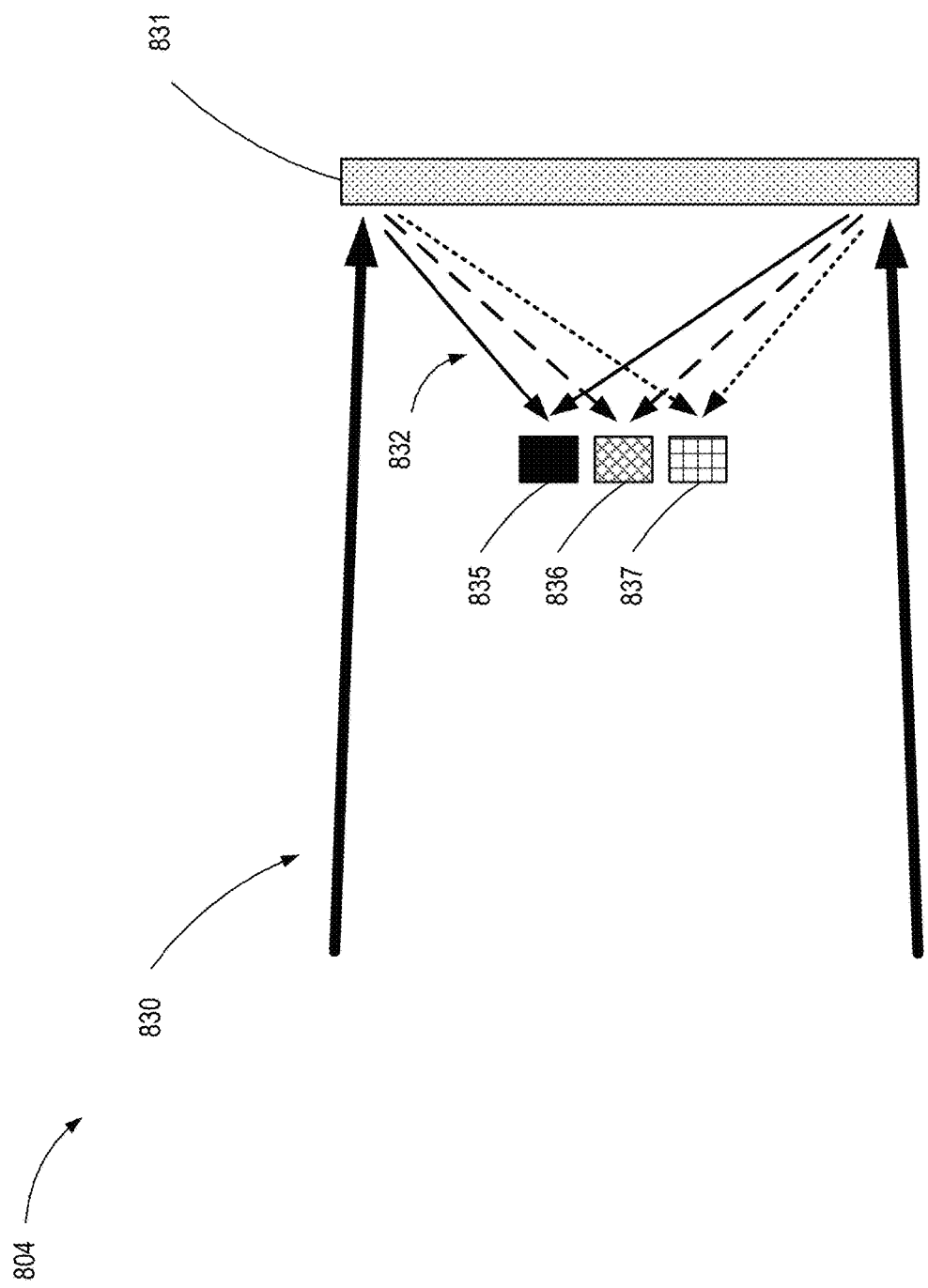
FIG. 8 illustrates a block diagram of an optical path of another reflective-type imaging system that includes a single metamaterial lens and discrete image sensors for each of three distinct color channels, according to one embodiment.

FIG. 8 illustrates a block diagram of an optical path of another reflective-type imaging system 804 that includes a single metamaterial lens 831 and discrete red, green, and blue (RGB) image sensors 835, 836, and 837, according to one embodiment. The illustrated embodiment leverages the unique ability of the metalens design that allows for frequency-based variations in the reflection angles. The metasurface 831 can be designed, as described herein, with a first set of pillars having interelement spacings and diameters to reflect green light from the incident optical radiation 830 as optical radiation 832 focused on the green channel digital image sensor 836. The metasurface 831 can be designed, as described herein, with a second set of pillars having interelement spacings and diameters to reflect red light from the incident optical radiation 830 as optical radiation 832 focused on the red channel digital image sensor 835. Similarly, the metasurface 831 can be designed, as described herein, with a second set of pillars having interelement spacings and diameters to reflect blue light from the incident optical radiation 830 as optical radiation 832 focused on the blue channel digital image sensor 837.

The metalens 831 provides frequency-selective focusing of optical radiation on each of the plurality of color channels 835, 836, and 837. That is, the reflected red light is focused on the digital image sensor for the red channel 835, the reflected blue light is focused on the digital image sensor for the blue channel 837, and the reflected green light is focused on the digital image sensor for the green channel 836. Accordingly, the digital image sensors do not need and may omit the typical color filters and/or microlenses.

Figure 9B:
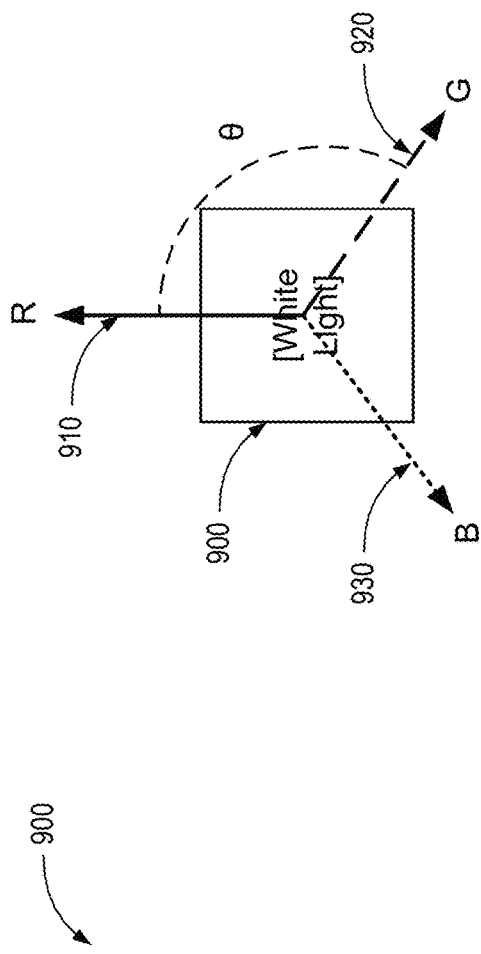
FIG. 9B illustrates a front view of the operation of the flat prism metalens lenslet, according to one embodiment.
Figure 9C:
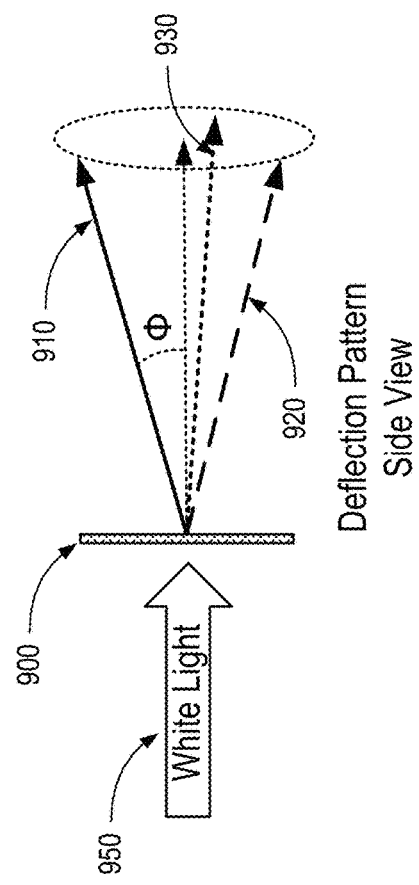
FIG. 9C illustrates a side view of the operation of the flat prism metalens lenslet, according to one embodiment.
Figure 9A:
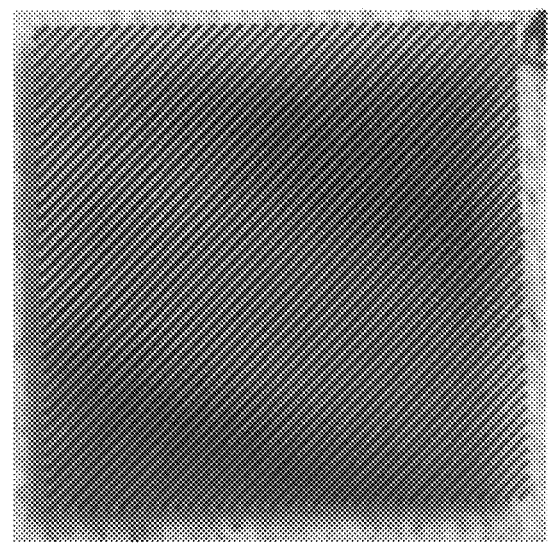
FIG. 9A illustrates a diagram of metalens lenslet to operate as a flat prism, according to one embodiment.

FIG. 9A illustrates a diagram of metalens lenslet to operate as a flat prism, according to one embodiment. The metasurface may, for example, be approximately 100 micrometers on a side and operate to spatially separate red, green, and blue color channels. As described herein, the metasurface may include a first set of pillars having interelement spacings and diameters to deflect green light, a second set of pillars having interelement spacings and diameters to reflect red light, and a third set of pillars having interelement spacings and diameters to reflect blue light. According to some embodiments, the first, second, and third sets of pillars may be interleaved on the surface of the metalens or arranged in small groupings or subarrays of each color channel set.

FIG. 9B illustrates a front view of the operation of the flat prism metalens lenslet 900, according to one embodiment. As illustrated, white light incident on the flat prism metalens lenslet 900 is deflected to direct the red light 910 in a first direction at an angle relative to the green light 920 directed in a second direction and the blue light 930 directed in a third direction.

FIG. 9C illustrates a side view of the operation of the flat prism metalens lenslet 900, according to one embodiment, again, the incident white light 950 is split into red 910, green 920, and blue 930 color channels that are each deflected at different angles.

Figures 10A, 10B:
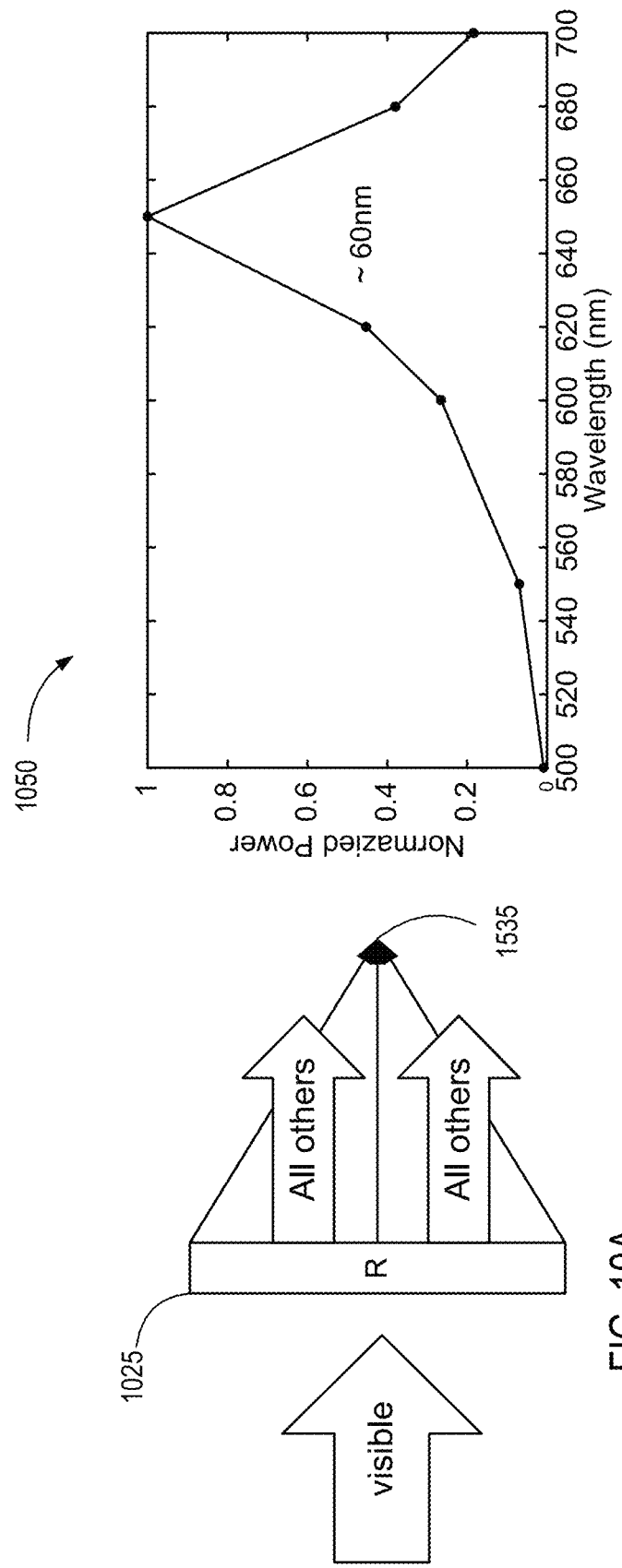
FIG. 10A illustrates an example of a transmissive metalens filter to focus a narrow band of optical radiation, according to one embodiment.
FIG. 10B illustrates a graph of the normalized power of the filtered and focused optical radiation with respect to wavelength, according to one embodiment.

FIG. 10A illustrates an example of a transmissive metalens filter 1025 to focus a narrow band of optical radiation to a focal point 1035, according to one embodiment. Optical radiation outside of the narrow band passes through the transmissive metalens filter 1025 without being focused.

FIG. 10B illustrates a graph 1050 of the normalized power of the filtered and focused optical radiation with respect to wavelength, according to one embodiment. In the illustrated embodiment, a 60-nanometer band centered on approximately 650 nanometers is focused by the transmissive metalens filter 1025. Other frequencies are not deflected to the focal point 1035. Accordingly, the transmissive metalens filter 1025 can be described as a frequency-selective metalens or a narrowband filter and used for various applications to control the deflection of a narrow band of optical radiation.

Figure 11:
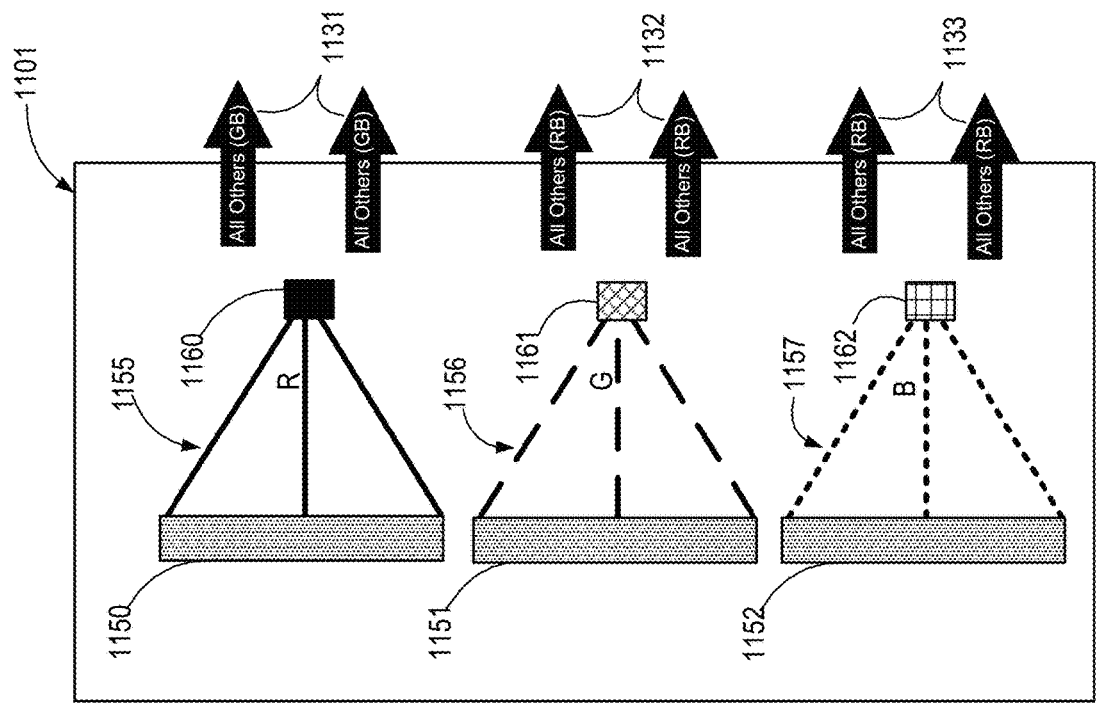
FIG. 11 illustrates a block diagram of an optical path of an imaging system using coplanar narrowband metalenses, according to one embodiment.

FIG. 11 illustrates a block diagram of an optical path of an imaging system 1101 using coplanar narrowband RGB metalenses 1150, 1151, and 1152, according to one embodiment. As described herein, the resonances of the pillar arrays of the metalenses 1150, 1151, and 1152 can be selected to focus a narrow band of wavelengths without deflecting other wavelengths outside of the designed resonant frequency. As illustrated, visible light 130 is received by coplanar, narrowband metalenses 1150, 1151, and 1152. The red narrowband metalens 1150 focuses the red optical radiation 1155 on a red digital image sensor 1160. Other wavelengths 1131 of the visible light 1130 pass through the red narrowband metalens 1150 undeflected and unfocused, including green and blue visible light.

The green narrowband metalens 1151 focuses the green optical radiation 1156 on a green digital image sensor 1161. Other wavelengths 1132 of the visible light 1130 pass through the green narrowband metalens 1151 undeflected and unfocused, including red and blue visible light. The blue narrowband metalens 1152 focuses the green optical radiation 1157 on a blue digital image sensor 1162. Other wavelengths 1133 of the visible light 1130 pass through the blue narrowband metalens 1152 undeflected and unfocused, including red and blue visible light.

Figure 12:
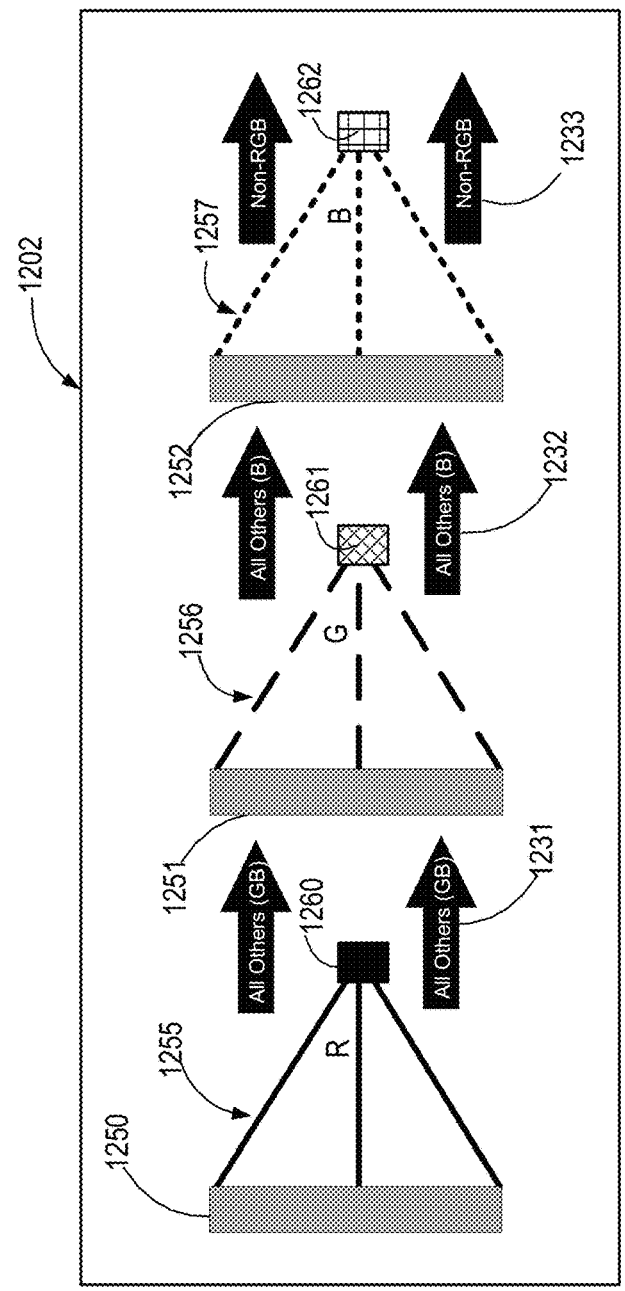
FIG. 12 illustrates a multichannel metalens filter to sequentially focus green, blue, and redlight on respective imaging sensors, according to one embodiment.

FIG. 12 illustrates a block diagram of an optical path of an imaging system 1202 using sequential narrowband RGB metalenses 1250, 1251, and 1252, according to one embodiment. As illustrated, visible light 1230 is received by a red narrowband metalens 1250 that focuses the red light 1255 to a red digital image sensor 1260. The other wavelengths 1231, including blue and green wavelengths, pass through the red narrowband metalens 1250 to be received by the green narrowband metalens 1251. The green narrowband metalens 1251 focuses the green light 1256 on a green digital image sensor 1261. The other wavelengths 1232, including blue wavelengths, pass through the green narrowband metalens 1251 to be received by the blue narrowband metalens 1252. The blue narrowband metalens 1252 focuses the blue light 1257 on a blue digital image sensor 1262. The other wavelengths 1233 (i.e., all the non-RGB wavelengths) pass through the blue narrowband metalens 1252.

Figure 13B:
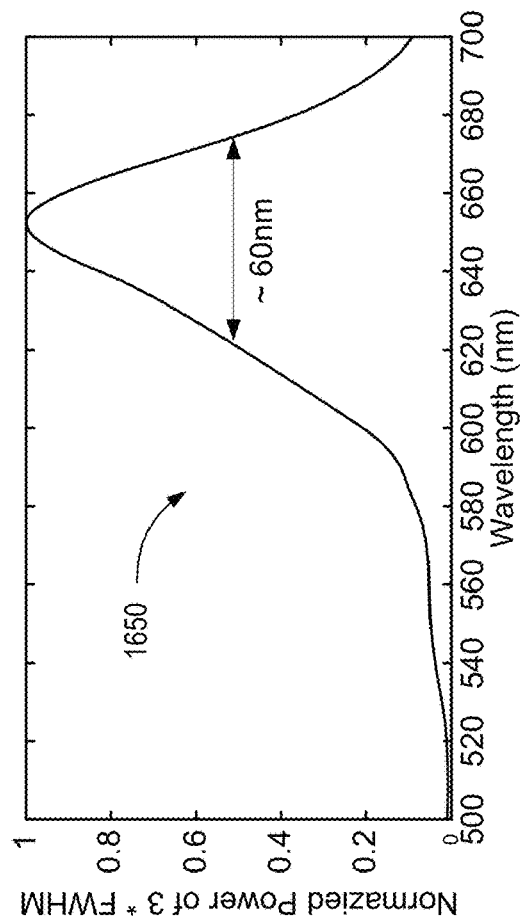
FIG. 13B illustrates a graph of the normalized power of the filtered and focused optical radiation with respect to wavelength, according to one embodiment.
Figure 13A:
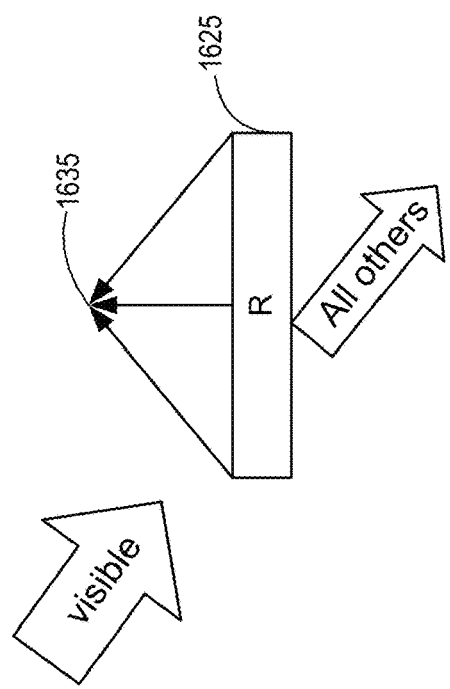
FIG. 13A illustrates a reflective metalens filter to focus a narrow band of optical radiation, according to one embodiment.

FIG. 13A illustrates a reflective metalens filter 1325 to reflectively focus a narrow band of optical radiation to a focal point 1335, according to one embodiment. Optical radiation outside of the narrow band passes through the reflective metalens filter 1325 without being reflected.

FIG. 13B illustrates a graph 1350 of the normalized power of the filtered and focused optical radiation with respect to wavelength, according to one embodiment. Again, approximately a 60-nanometer band of optical radiation centered on 650 nanometers is reflectively focused by the metalens filter 1325. Other frequencies are not reflected. Instead, frequencies outside of the narrow band are passed through or marginally deflected to a location other than the focal point 1335.

Though not illustrated, a complete RGB imaging system can be generated by adding green and blue narrowband reflective metalenses to the illustrated red channel narrowband reflective metalens 1625. Many of the embodiments illustrated and described herein are provided in the context of RGB digital imaging sensors and visible light. However, it is appreciated that the metalenses can be configured for narrowband operation in wavelengths outside of the visible spectrum. For example, a metalens may be configured to selectively focus a narrow band of ultraviolet light and/or infrared light instead of, or in addition to, visible light. Images generated based on non-visible bands can be displayed for human viewing using false-color representations.

Figure 14B:
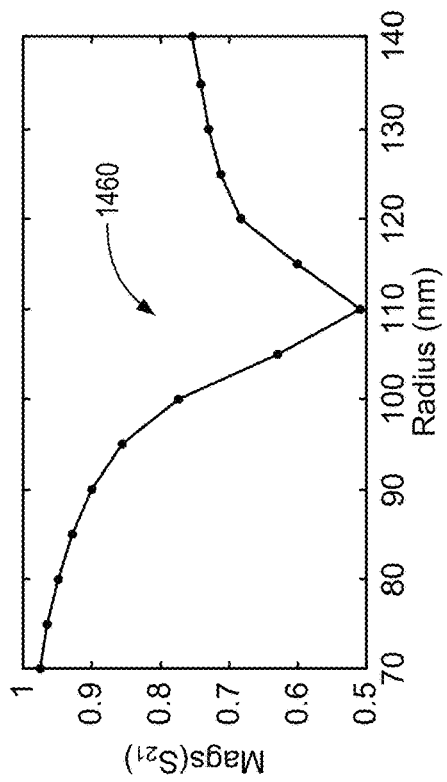
FIG. 14B illustrates a graph of the magnitude relative to radius selection of the array of passive deflector elements, according to one embodiment.
Figure 14C:
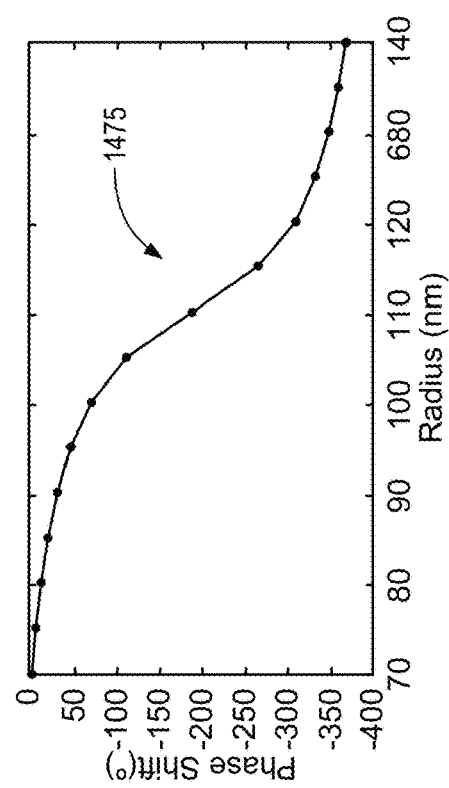
FIG. 14C illustrates a graph of the phase shift relative to the various radius selections of the array of passive deflector elements, according to one embodiment.
Figure 14A:
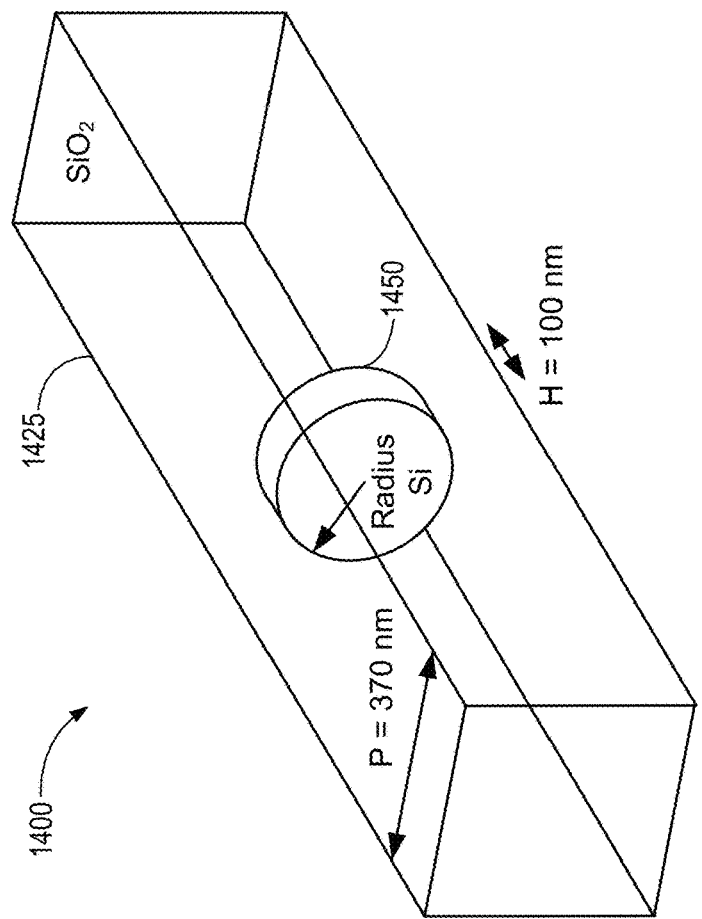
FIG. 14A illustrates a unit cell of an example narrowband frequency-selective filter, according to one embodiment.

FIG. 14A illustrates a unit cell 1400 of an example narrowband frequency-selective filter, according to one embodiment. As illustrated, a disk-shaped array of deflector elements 1450 is positioned within a substrate 1425. The unit cell 1400 may be replicated as part of a one-dimensional or two-dimensional array with an interelement spacing of approximately 370 nanometers, in some embodiments. The substrate 1425 may, for example, be formed of $SiO_2$. The disk of deflector elements 1450 may include deflector elements that have a height of approximately 100 nanometers, in some embodiments.

FIG. 14B illustrates a graph 1460 of the magnitude relative to radius selection of the array of passive deflector elements in the disk-shaped array of deflector elements 1450 of FIG. 14A, according to one embodiment.

FIG. 14C illustrates a graph 1475 of phase shift values relative to the various radius selections of the disk-shaped array of passive deflector elements 1450 of FIG. 14A, according to one embodiment. Similar to previously described embodiments, the radius of the disk-shaped array of passive deflector elements 1450 may be selected to achieve a target functionality of transmissivity and tunability.

Figure 14D:
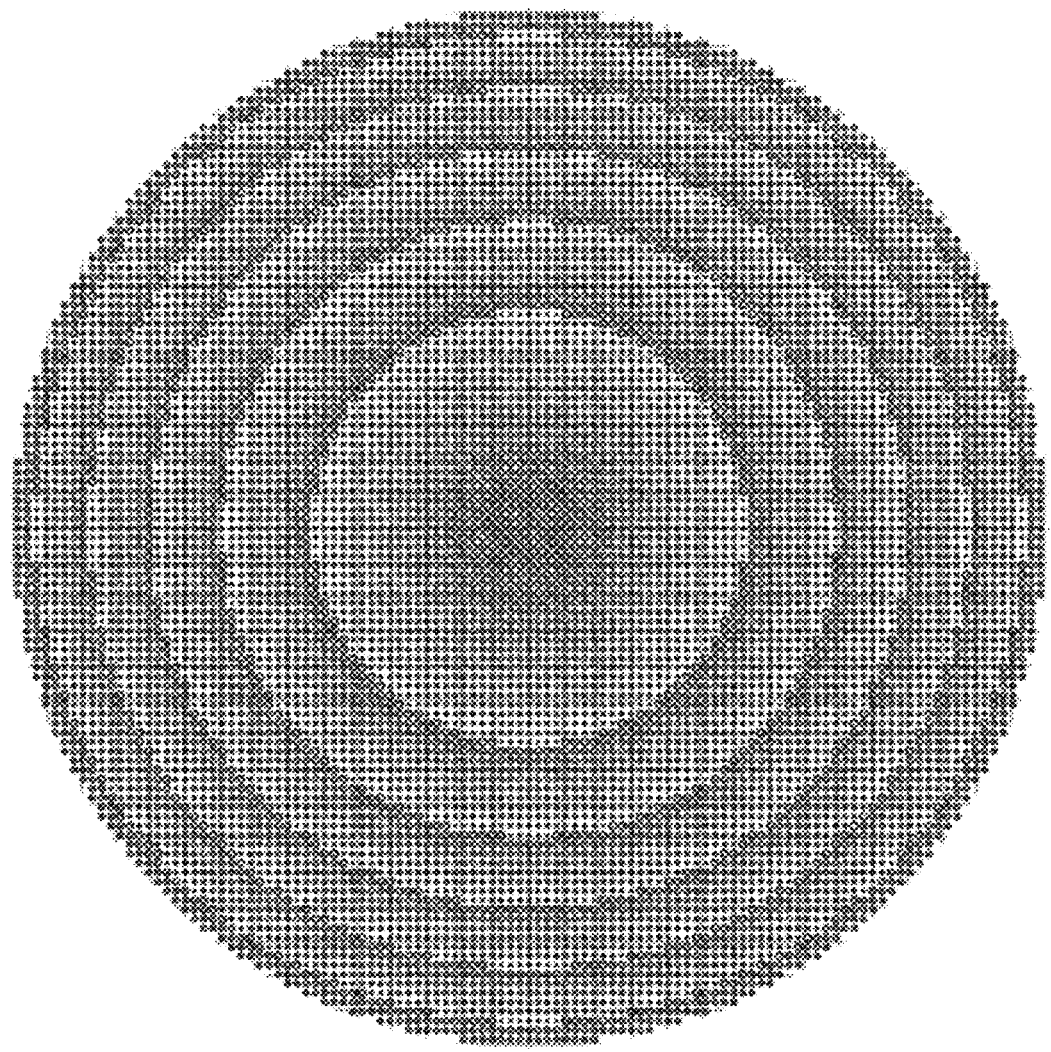
FIG. 14D illustrates an example block diagram of an array of passive deflector elements for use in a circular unit cell of a frequency-selective filter, according to one embodiment.

FIG. 14D illustrates an example of a narrowband, polarization-independent metalens 1401 comprising a pattern of nanopillars, according to one embodiment. The nanopillars (also referred to herein as simply "pillars") are arranged in rows and columns in the illustrated example; however, it is appreciated that the pillars could be arranged in concentric rings or other patterns. The discussion that follows provides numerous variations, embodiments, and examples of pillar configurations and dimensions to achieve target resonances, narrowband frequency-selective responses, arrangements of pillars, spacing, and other variations. For example, while the metalens 1401 is illustrated as a circle or thin disk, alternative embodiments of the pattern of nanopillars may form a rectangle, square, or another geometric shape.

Figure 14E:
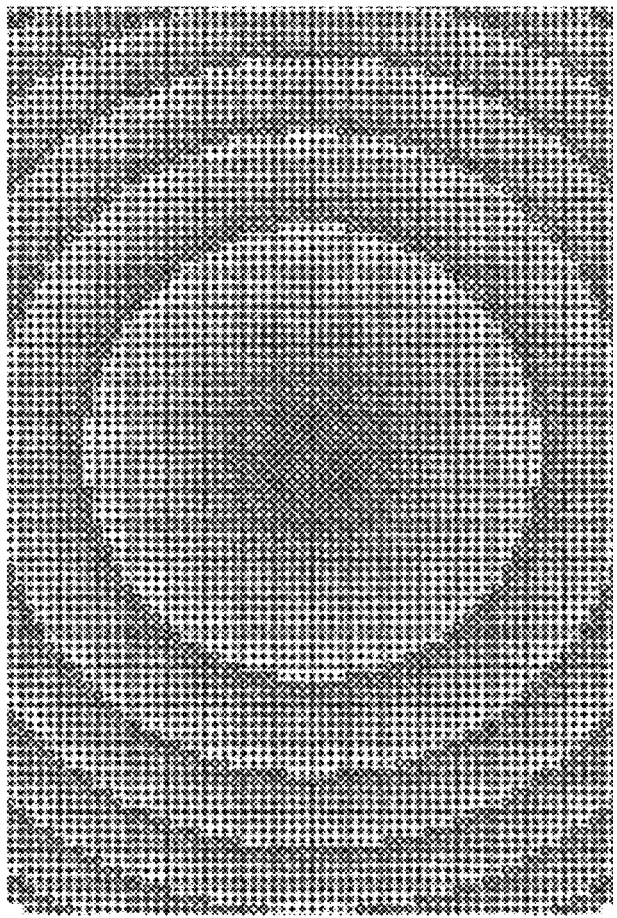
FIG. 14E illustrates an example block diagram of an array of passive deflector elements for use in a rectangular unit cell of a frequency-selective filter, according to one embodiment.

FIG. 14E illustrates an example of a narrowband, polarization-independent metalens 1402 comprising a pattern of nanopillars that form a rectangular thin-prism shape, according to one embodiment. The rectangular thin-prism shape may focus received optical radiation of a specific frequency or narrow frequency band onto, for example, a corresponding rectangular digital imaging sensor.

Figure 15B:
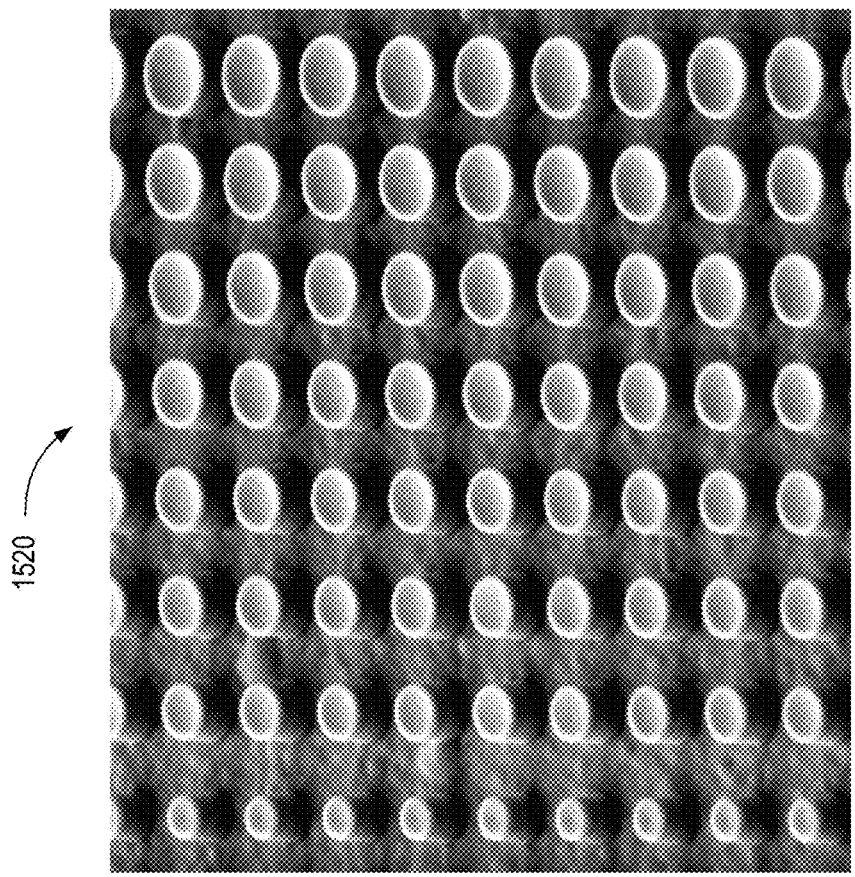
FIG. 15B illustrates an enlarged perspective view of the example representation of the pattern of deflector elements in the metalens of FIG. 15A, according to one embodiment.
Figure 15A:
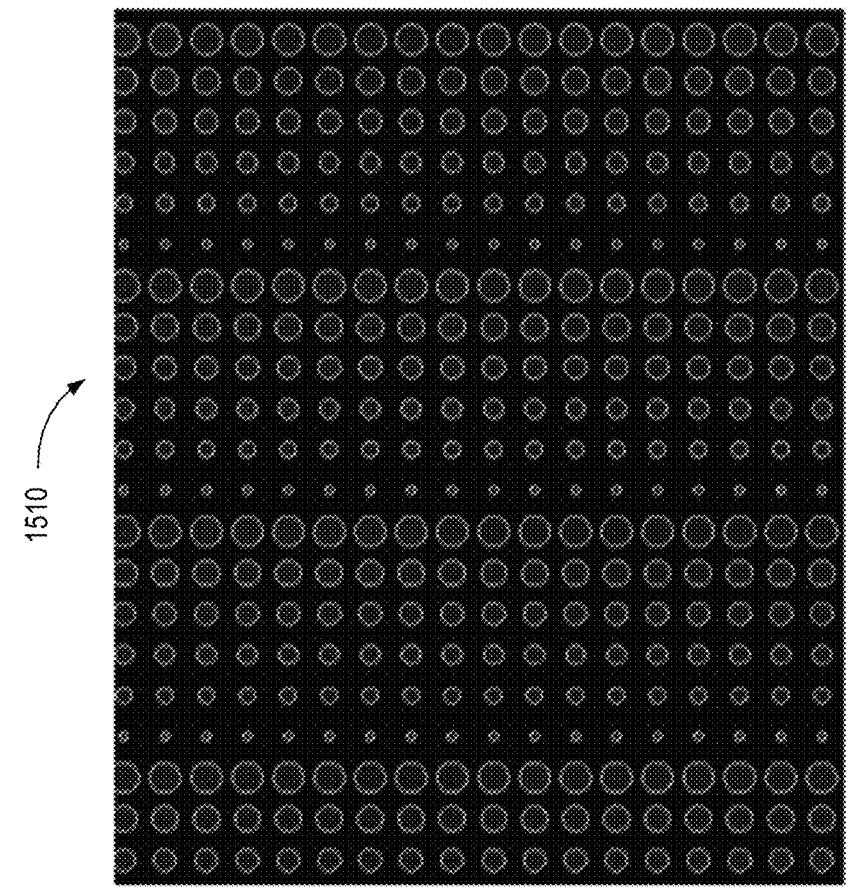
FIG. 15A illustrates a top-down view of an example representation of a pattern of deflector elements for a metalens structure, according to one embodiment.

FIG. 15A illustrates a top-down view of an example representation of a pattern of deflector elements 1510 for a metalens structure, according to one embodiment. The illustrated example includes a square grid of deflector elements 1510 with uniform spacings between adjacent deflector elements. The deflector elements 1510 may be configured with uniform heights. In the illustrated example, the deflector elements 1510 comprise circular pillars arranged in a repeating pattern of pillar diameters. The illustrated rows and columns of deflector elements 1510 may instead be curved to form concentric rings as part of a circular metalens.

FIG. 15B illustrates an enlarged perspective view of the example representation of the pattern of deflector elements 1510 in the metalens of FIG. 15A, according to one embodiment. As illustrated, the array of deflector elements 1520 includes a uniformly spaced arrangement of circular pillars extending from a substrate. The deflector elements 1520 have different pillar diameters that increase along one dimension (left to right) and are constant along the other dimension (top to bottom). As previously noted, the pillars may be arranged in concentric rings as part of a circular metalens. In some embodiments, rows and columns of pillars may be offset and truncated to form an approximation of concentric circles, as described herein.

Figure 16A:
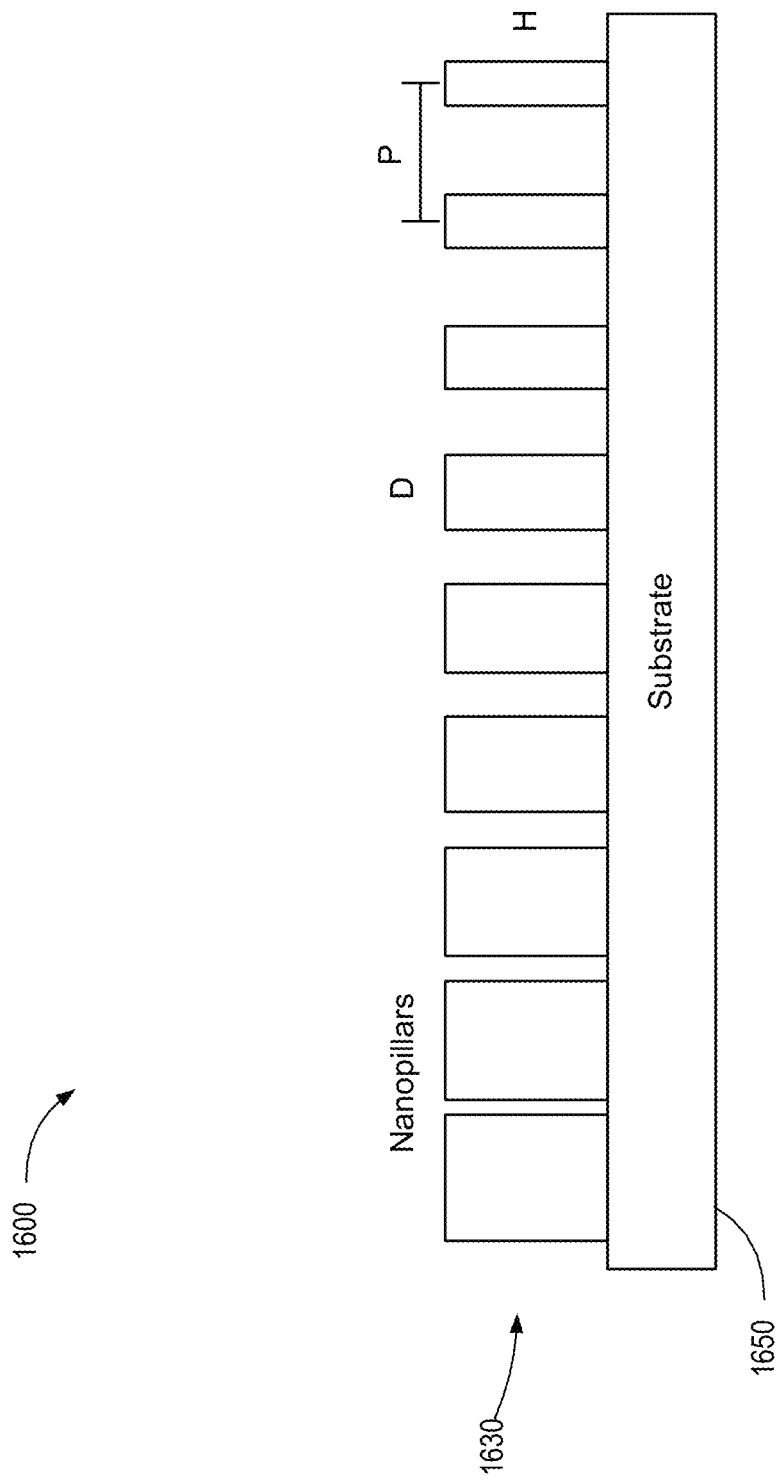
FIG. 16A illustrates an example block diagram of a side view of a metalens with nanopillar deflectors positioned on a substrate, according to one embodiment.

FIG. 16A illustrates an example block diagram of a side view of a metalens 1600 illustrating the nanopillar deflector elements 1630 positioned on a substrate 1650, according to one embodiment. As illustrated, the nanopillar deflector elements 1630 may have a uniform height, H, and varying diameters, D. In the illustrated example, the nanopillar deflector elements 1630 are evenly spaced with a distance, P, between the centers of adjacent nanopillars. As described herein, the dimensions, pattern, and spacings of the nanopillars are selected to achieve a target deflection pattern (e.g., angle of deflection, dispersion, collimation, convergence, etc.) and frequency response (e.g., target operational bandwidth of optical radiation).

Figure 16B:
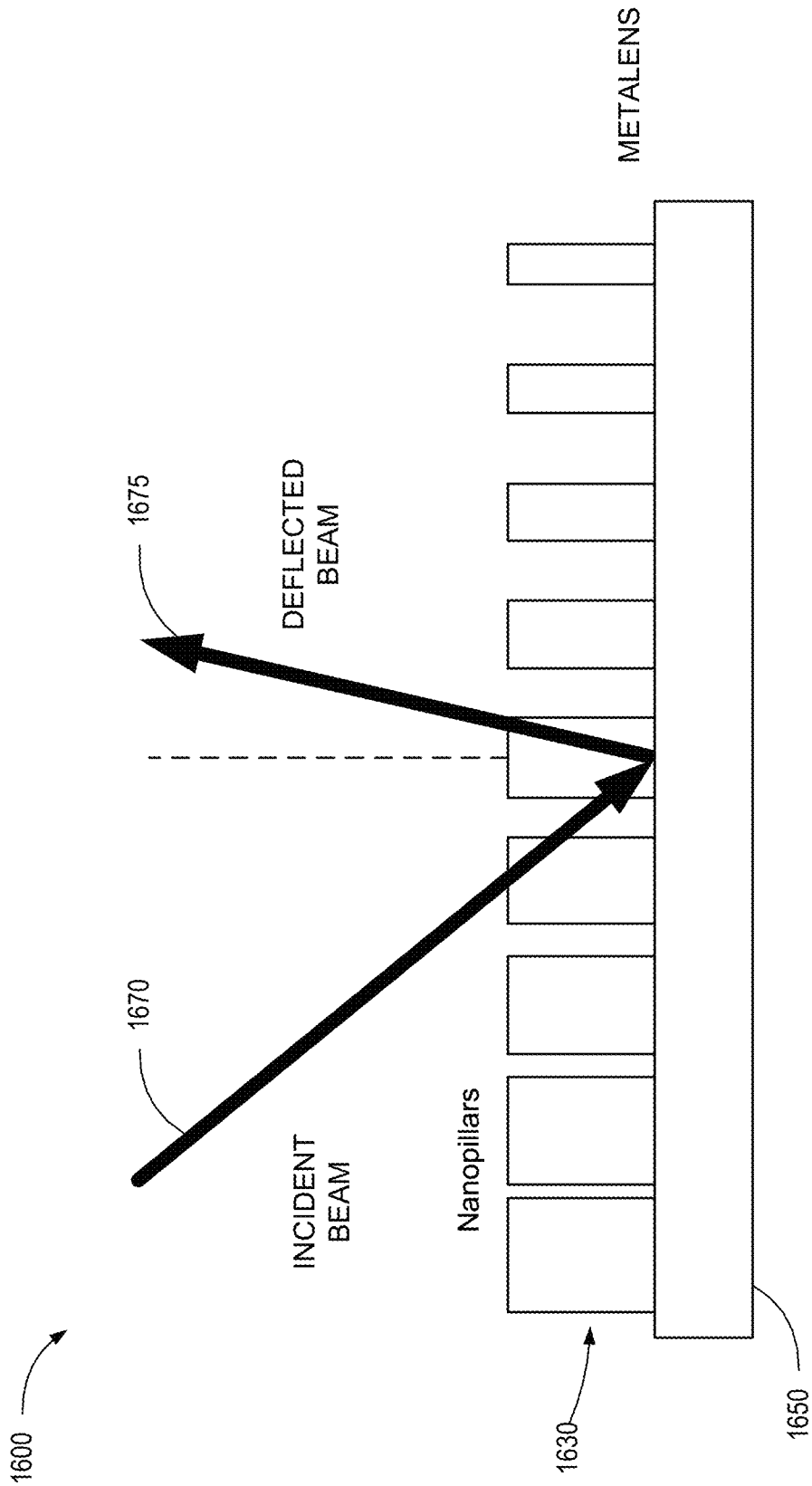
FIG. 16B illustrates the example block diagram of the metalens of FIG. 16A operating to reflect incident optical radiation, according to one embodiment.

FIG. 16B illustrates the example block diagram of the metalens 1600 of FIG. 16A operating to reflect incident optical radiation 1670 as deflected optical radiation 1675 at a target deflection angle, according to one embodiment.

Figure 16C:
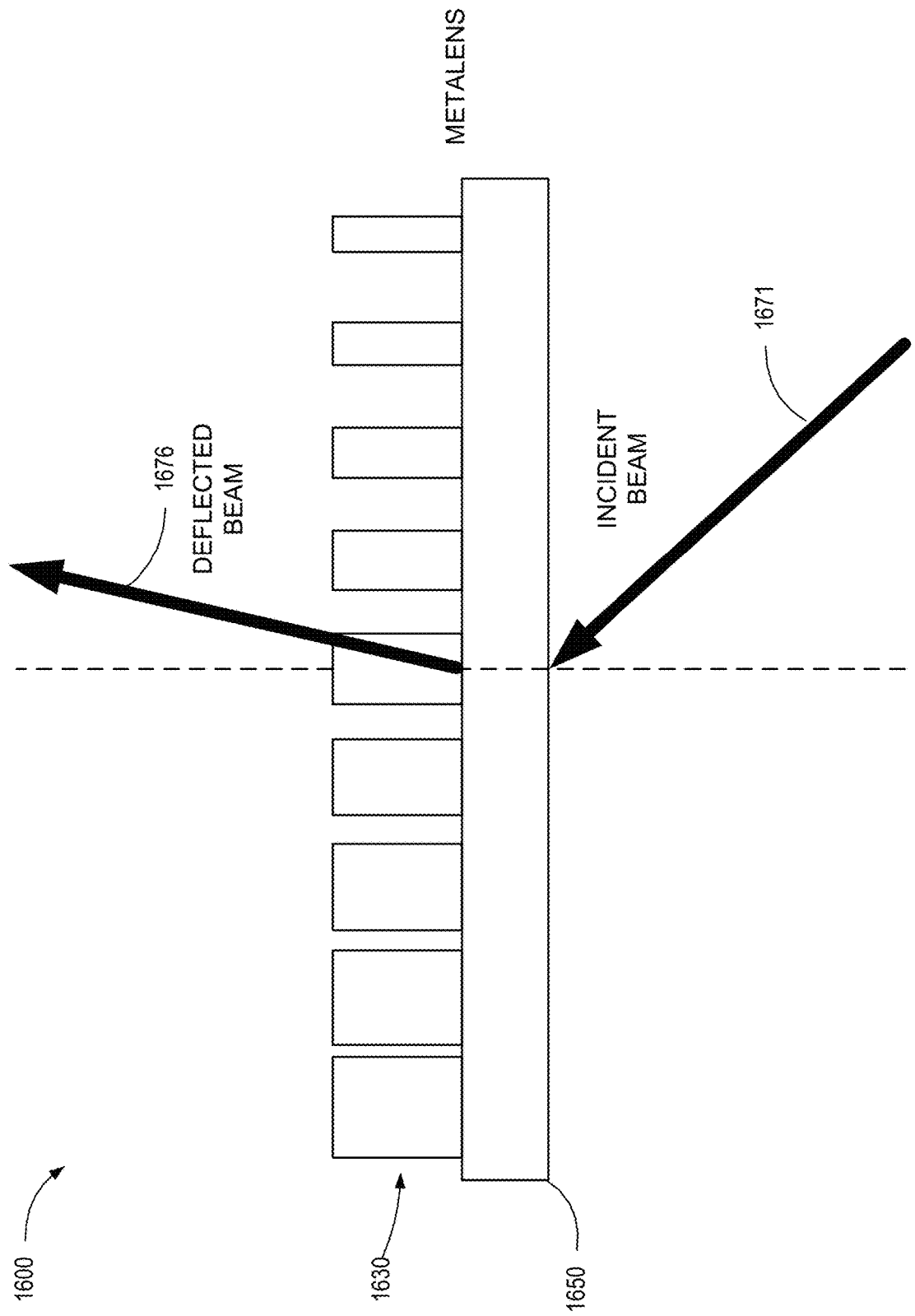
FIG. 16C illustrates the example block diagram of the metalens of FIG. 16A transmissively steering incident optical radiation, according to one embodiment.

FIG. 16C illustrates the example block diagram of the metalens 1600 of FIG. 16A transmissively steering incident optical radiation 1671 as deflected optical radiation 1676 at a target deflection angle, according to one embodiment.

The number of pillars in each repeating pattern may vary according to the specific frequency and target deflection angle. The following specific examples of on-center spacings, P, heights, H, and diameters, D, are relevant to various patterns of deflector elements, including the illustrated examples of repeating patterns of nanopillars on a substrate. According to one specific embodiment, the deflector elements of a green metalens may have a height, H, of approximately 260 nanometers and on-center spacings, P, of approximately 180 nanometers for green light having a wavelength of approximately 550 nanometers. The height, H, and on-center spacings, P, may be adjusted or specified based on the specific frequency or frequency range of the green light.

In one embodiment, the diameters, D, of the nanopillars in a green metalens may range between approximately 80 nanometers and 140 nanometers to attain phase shifts exceeding a $2\pi$ range. A target pattern of phase shifts across the two-dimensional arrangement of repeating rows of nanopillars in the green metalens may be selected to achieve a target deflection pattern for green light. Other frequencies of light may be unaffected by the metalens (e.g., pass through the metalens without being deflected). Furthermore, the number of nanopillars in each row of repeating nanopillars of varying diameters may be determined based on the target deflection pattern and the specific frequency or frequency range of green light. The total number of rows and columns of repeating patterns of nanopillars of varying diameters may depend on the total length and width of the green metalens. For example, the metalens may be sized according to a target aperture or F-stop of the imaging system.

The deflector elements of a blue metalens may have a height, H, of approximately 260 nanometers and on-center spacings, P, of approximately 180 nanometers for blue light having a wavelength of approximately 490 nanometers. Again, the height, H, and on-center spacings, P, may be adjusted or specified based on the specific frequency or frequency range of the blue light. The diameters, D, of the nanopillars in each repeating row of nanopillars in the blue metalens may range between approximately 40 nanometers and 140 nanometers to attain phase shifts exceeding a 2π range. A target pattern of phase shifts across the two-dimensional arrangement of repeating rows of nanopillars in the blue metalens may be selected to achieve a target deflection pattern (e.g., reflection angle, diffraction angle, refraction angle). Furthermore, the number of nanopillars in each row of repeating nanopillars of varying diameters may be determined based on the target deflection pattern and/or the specific frequency or frequency range of blue light. The total number of rows and columns of repeating patterns of nanopillars of varying dimensions may depend on the total length and width of the blue metalens.

In the illustrated example embodiment, the deflector elements of a red metalens may have a height, H, of approximately 260 nanometers and on-center spacings, P, of approximately 230 nanometers for red light having a wavelength of approximately 635 nanometers. Again, the height, H, and on-center spacings, P, may be adjusted or specified based on the specific frequency or frequency range of the red light. The total size (e.g., length and width or diameter) of the red metalens may be sized to provide a target aperture or target F-Stop of the imaging system (e.g., telescope or camera).

The diameters, D, of the nanopillars in each repeating row of nanopillars in the red metalens may range between approximately 100 nanometers and 210 nanometers to attain phase shifts exceeding a 2π range. A target pattern of phase shifts across the two-dimensional arrangement of repeating rows of nanopillars in the red metalens may be selected to achieve a target deflection pattern (e.g., reflection angle, diffraction angle, or refraction angle) for the narrow band of light. Furthermore, the number of nanopillars in each row of repeating nanopillars of varying diameters may be determined based on the target deflection pattern and/or the specific frequency or frequency range of red light. The total number of rows and columns of repeating patterns of nanopillars of varying dimensions may depend on the target diameter of the red metalens 943.

In the illustrated example, as described above, the heights of the nanopillars for each of the red, green, and blue metalenses are the same. In alternative embodiments, the heights of the nanopillars of each different color metalens may be different. The example metalenses described herein are for RGB digital image sensors. However, it is appreciated that alternative digital image sensor color schemes are possible, as are digital image sensors that reconstruct images using more than three colors (e.g., MultiPrimary digital image sensors, such as those using RGBY, RGBW, or RGBYC pixels and subpixels).

Rings of concentric nanopillars may be spaced with on-center spacings, P, from adjacent nanopillars in an adjacent ring may be constant, as described herein. In some embodiments, on-center spacing, P, of adjacent nanopillars in adjacent rings may be a function of the frequency of light to be deflected (e.g., refracted, diffracted, or reflected). Accordingly, on-center spacing, P, of adjacent nanopillars for a blue metalens may be different from the on-center spacing, P, of adjacent nanopillars for a red or green metalens.

The spacing between nanopillars in adjacent nanopillar rings may be the same as the on-center spacing, P, of adjacent nanopillars in an individual ring of nanopillars of the metalens. Alternatively, the spacing between nanopillars in adjacent rings of nanopillars may be different from the on-center spacing, P, of adjacent nanopillars in an individual ring of nanopillars of the metalens.

FIG. 17A illustrates an example unit cell 1700 of a red metalens subpixel, according to one embodiment. As illustrated, a poly-Si cylindrical deflector element 1705 extends from a SiO$_2$ substrate 1703 with a height of 280 nanometers. The on-center interelement spacing of the array of unit cells forming the red metalens subpixel may be 270 nanometers. The red metalens subpixel may include unit cells with deflector elements 1705 having diameters ranging from 80 nanometers to 180 nanometers to attain phase shifts exceeding a 2π range.

FIG. 17B illustrates a graph of transmission efficiency values (Y-axis) for various diameters (X-axis) of a cylindrical deflector element in a unit cell of a metalens for a red subpixel of an LED display with a wavelength of approximately 650 nanometers, according to one embodiment.

FIG. 17C illustrates a graph of various phase shift values (Y-axis) for various diameters (X-axis) of a cylindrical deflector element for a red subpixel, according to one embodiment. As illustrated, various possible ranges of deflector element diameters could be used to attain a phase shift range of 2π.

FIG. 17D illustrates the diffraction efficiency at various diffraction orders of the cylindrical deflector element in the unit cell for the example red metalens subpixel of FIG. 17A. As illustrated, the diffraction efficiency of first-order diffractions is approximately 80%.

Figure 18B:
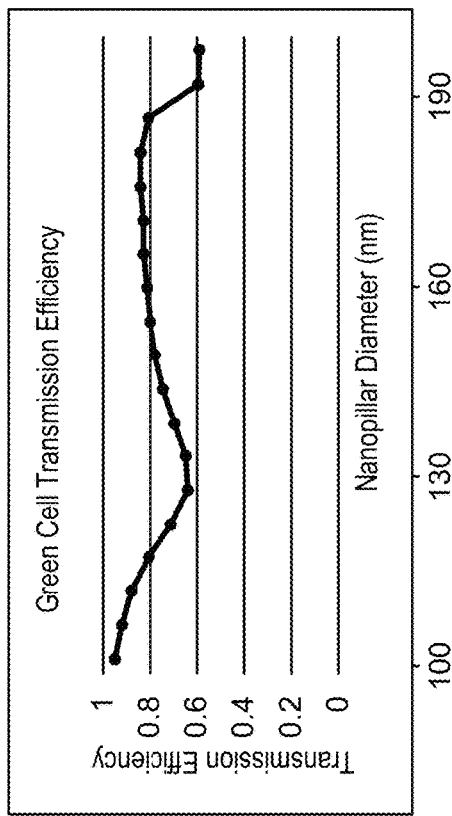
FIG. 18B illustrates transmission values for various diameters of a cylindrical deflector element in a unit cell for the example green metalens subpixel of FIG. 18A, according to one embodiment.
Figure 18D:
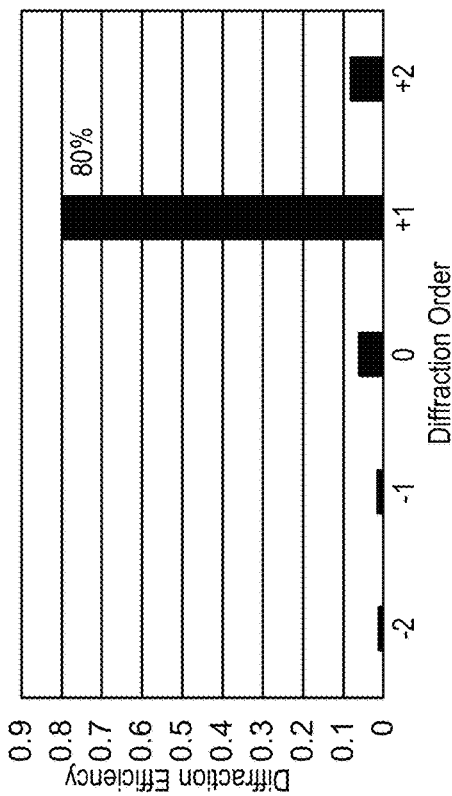
FIG. 18D illustrates the diffraction efficiency at various diffraction orders of the cylindrical deflector element in the unit cell for the example green metalens subpixel of FIG. 18A.
Figure 18A:
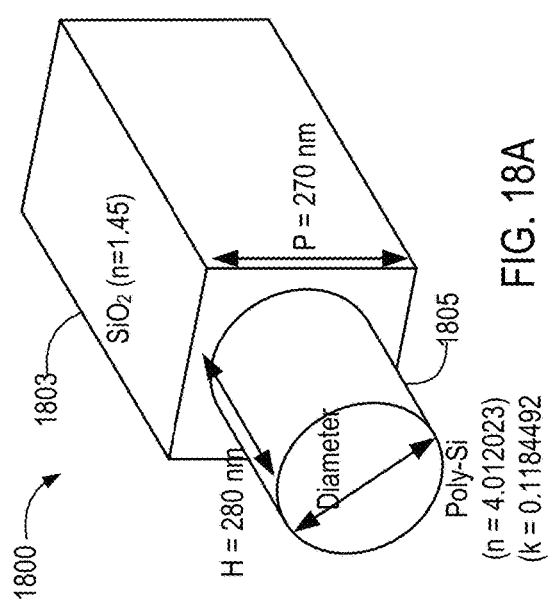
FIG. 18A illustrates an example unit cell of a green metalens subpixel, according to one embodiment.

FIG. 18A illustrates an example unit cell 1800 of a green metalens subpixel, according to one embodiment. In the illustrated example, a poly-Si cylindrical deflector element 1805 extends from a SiO$_2$ substrate 1803 with a height of 280 nanometers. The on-center interelement spacing of the array of unit cells forming the green metalens subpixel may be 270 nanometers. Accordingly, the interelement spacing and the heights of the deflector elements of the red (1703 in FIG. 17A) and green (1803 in FIG. 18A) deflector elements may be the same. However, the green metalens subpixel may include unit cells with deflector elements 1805 having diameters ranging from 80 nanometers to 140 nanometers to attain phase shifts approaching a 2π range. Smaller ranges of diameters may be utilized in applications where phase shift ranges of less than 2π are sufficient.

FIG. 18B illustrates a graph of transmission efficiency values (Y-axis) for various diameters (X-axis) of a cylindrical deflector element in a unit cell of a metalens for a green subpixel of an LED display with a wavelength of approximately 535 nanometers, according to one embodiment. As illustrated, a range of diameters between 120 nanometers and 190 nanometers can be used while maintaining a relatively high transmission efficiency.

Figure 18C:
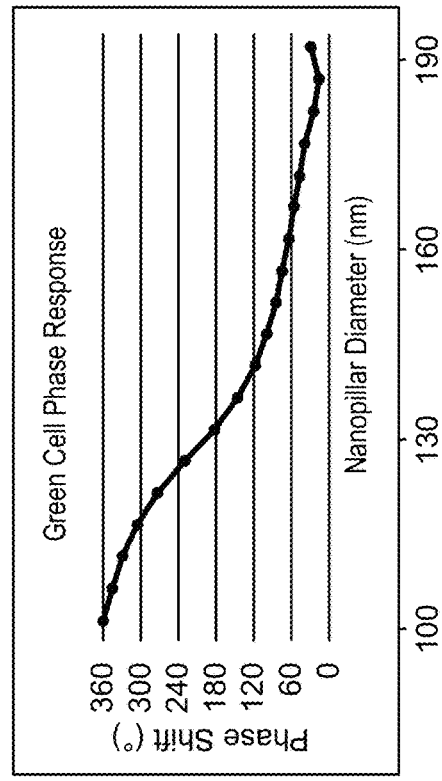
FIG. 18C illustrates phase shift values for various diameters of a cylindrical deflector element in a unit cell for the example green metalens subpixel of FIG. 18A, according to one embodiment.

FIG. 18C illustrates a graph of various phase shift values (Y-axis) for various diameters (X-axis) of the cylindrical deflector element for the green subpixel, according to one embodiment.

FIG. 18D illustrates the diffraction efficiency at various diffraction orders of the cylindrical deflector element in the unit cell for the example green metalens subpixel of FIG. 18A. As illustrated, the diffraction efficiency of first-order diffractions is approximately 80%.

Figure 19B:
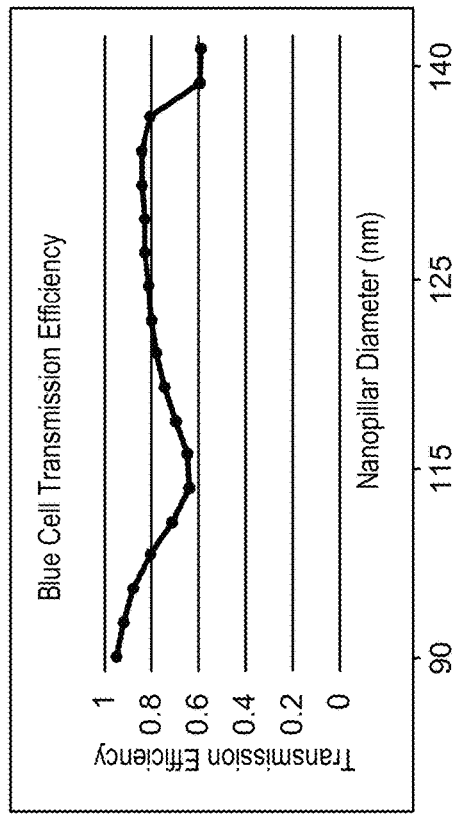
FIG. 19B illustrates transmission values for various diameters of a cylindrical deflector element in a unit cell for the example blue metalens subpixel of FIG. 19A, according to one embodiment.
Figure 19D:
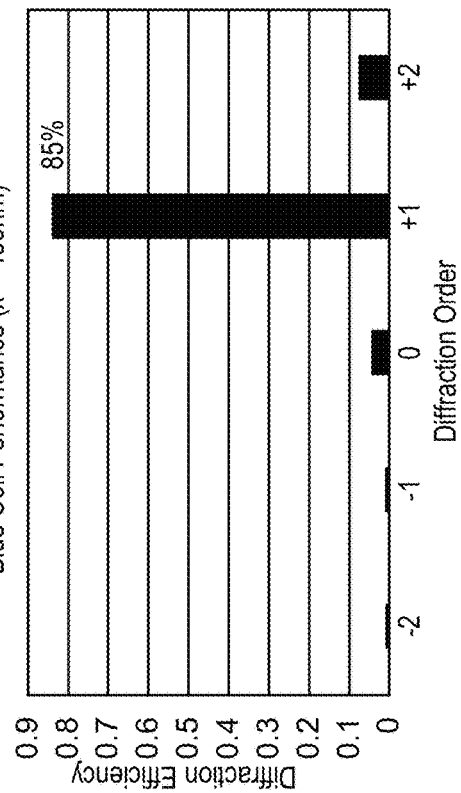
FIG. 19D illustrates the diffraction efficiency at various diffraction orders of the cylindrical deflector element in the unit cell for the example blue metalens subpixel of FIG. 19A.
Figure 19A:
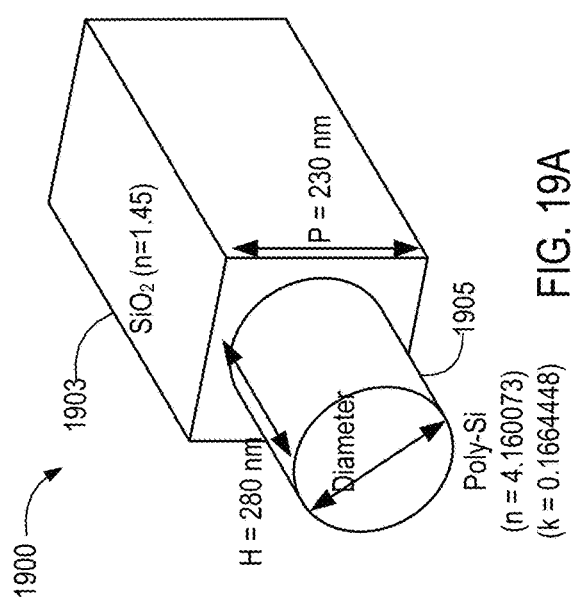
FIG. 19A illustrates an example unit cell of a blue metalens subpixel, according to one embodiment.

FIG. 19A illustrates an example unit cell 1900 of a blue metalens subpixel, according to one embodiment. In the illustrated example, a poly-Si cylindrical deflector element 1905 extends from a $SiO_2$ substrate 1903 with a height of 280 nanometers. The on-center interelement spacing of the array of unit cells forming the blue metalens subpixel may be 230 nanometers. The blue metalens subpixel may include unit cells with deflector elements 1905 having diameters ranging from 40 nanometers to 140 nanometers to attain phase shifts approaching a $2\pi$ range.

FIG. 19B illustrates a graph of transmission efficiency values (Y-axis) for various diameters (X-axis) of a cylindrical deflector element in a unit cell of a metalens for a blue subpixel of an LED display with a wavelength of approximately 490 nanometers, according to one embodiment.

Figure 19C:
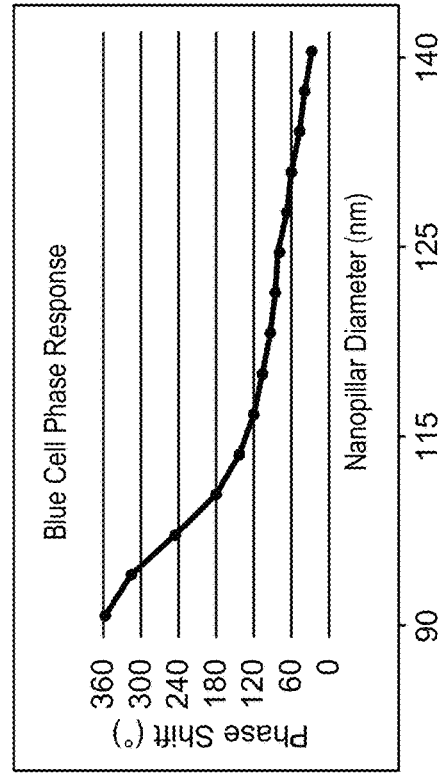
FIG. 19C illustrates phase shift values for various diameters of a cylindrical deflector element in a unit cell for the example blue metalens subpixel of FIG. 19A, according to one embodiment.

FIG. 19C illustrates a graph of various phase shift values (Y-axis) for various diameters (X-axis) of the cylindrical deflector element for the blue subpixel, according to one embodiment.

FIG. 19D illustrates the diffraction efficiency at various diffraction orders of the cylindrical deflector element in the unit cell for the example blue metalens subpixel of FIG. 19A. As illustrated, the diffraction efficiency of first-order diffractions is approximately 85% for the blue unit cell.

FIGS. 20A-20G illustrate an example process for fabricating a metalens with an array of passive deflector elements having varying diameters that extend from a substrate, according to one embodiment.

FIG. 20A illustrates a substrate, such as a fused silica substrate, that is cleaned.

FIG. 20B illustrates polysilicon deposited on the fused silica. For example, a low-pressure chemical vapor deposition process (LPCVD), such as an LPCVD process utilizing SiH4, may be used to deposit the polysilicon layer on the fused silica substrate. As noted, the polysilicon is annealed at a suitable temperature for enough time to reduce the absorptive losses and thereby improve the transmission efficiency of the finished metalens. For example, the polysilicon may be annealed at a temperature between 900 and 1100 degrees Celsius for a time period between 30 and 90 minutes, depending on the thickness of the polysilicon, target operational frequency bands, and other target characteristic functionalities. For example, the polysilicon optical properties may be improved by annealing the polysilicon in an inert ambient gas (e.g., Argon, N2, etc.) at a temperature above 1000 degrees Celsius for an hour or longer to lower the extinction coefficient in shorter wavelengths.

In some embodiments, plasma-enhanced chemical vapor deposition (PECVD), high-density plasma chemical vapor deposition (HDPCVD), and/or any of a wide variety of alternative chemical vapor deposition (CVD) processes may be utilized to deposit the poly-Si layer (or another suitable material) on the fused silica substrate (or another suitable substrate material).

FIG. 20C illustrates a resist, such as a photoresist, coating deposited on the polysilicon. In some embodiment, a negative photoresist is utilized, such as Ma-N 2403. However, it is appreciated that alternative photoresists may be utilized, including positive photoresists in which the masking and etching processes may be inversed or otherwise modified.

FIG. 20D illustrates electron-beam lithography (e-beam lithography) of the photoresist, development of the photoresist, and hard baking of the photoresist (e.g., to generate a hard baked photoresist pattern). The photoresist is specifically developed with a mask pattern that corresponds to a target array of pillar diameters for the finished metalens. The target array of pillars may be a two-dimensional array of pillars with patterns of diameters selected to attain a specific deflection response for a target range of wavelengths according to any of the reflective, diffractive, refractive, or filtering metalens designs contemplated and described herein or in the publication previously cited and incorporated by reference.

FIG. 20E illustrates a partial etching of the polysilicon. This first etching removes some of the polysilicon material between the pillars protected by the caps of photoresist on top but does not etch the polysilicon all the way down to the fused silica substrate. As such, this partial etching generates partially formed polysilicon pillars (or nanopillars) with an unetched layer of polysilicon between adjacent partially formed pillars. According to various embodiments, this first etching may include a reactive ion etching (RIE) process, such as RIE processes using HBr and/or Cl2.

FIG. 20F illustrates the removal of the photoresist mask layer to expose the partially formed polysilicon pillars and the unetched layer of polysilicon along the substrate. The photoresist removal process may include, for example, 02 plasma removal, H2 plasma removal, application of 1-methyl-2-pyrrolidone (NMP), application of dimethyl sulfoxide (DMSO), a combination thereof, and/or an alternative photoresist removal process.

FIG. 20G illustrates a second etching of the polysilicon to remove the unetched layer of the polysilicon and finish forming the completed polysilicon pillars extending from the substrate. This second etching of the polysilicon may reduce the height of the partially formed polysilicon pillars in FIG. 20F slightly. This further ensures that any remaining photoresist is completely removed from the completed polysilicon pillars. The two-step etching process allows the second etching to set the height of the pillars to attain target pillar heights. As detailed herein, the photoresist is removed (FIG. 20F) between the first etching (FIG. 20E) and the second etching (FIG. 20G).

FIGS. 21A-21F illustrate an example process for fabricating a metalens with an array of passive deflector elements having varying diameters that extend from a substrate, according to one embodiment.

In FIG. 21A, a fused silica substrate is cleaned. In FIG. 21B, a poly-Si layer is deposited on the fused silica substrate. The poly-Si layer may, for example, be deposited using a low-pressure chemical vapor deposition (LPCVD) process. In other embodiments, plasma enhanced chemical vapor deposition (PECVD), high-density plasma chemical vapor deposition (HDPCVD), and/or any of a wide variety of alternative chemical vapor deposition (CVD) processes may be utilized to deposit the poly-Si layer (or another suitable material) on the fused silica substrate (or another suitable substrate material). The poly-Si layer may be deposited with a thickness between 210 nanometers and 250 nanometers (e.g., 230 nanometers).

The polysilicon is then annealed to reduce the absorptive losses and thereby improve the transmission efficiency of the finished metalens. That is, rather than simply annealing to harden or stabilize the polysilicon, an annealing process is implemented at a suitable temperature and for a sufficient amount of time for the specific purpose of reducing the absorptive losses of optical radiation within a target operational bandwidth. In various embodiments, polysilicon that is generally not considered practical for use with optical frequencies is annealed to reduce absorptive losses by as much as 35%, thereby rendering the polysilicon suitable for use with optical frequencies.

As shown in FIG. 21C, a photoresist or other resist for lithography may be coated on the deposited poly-Si layer. In FIG. 21D, a lithography process, such as E-beam lithography (EBL) or another nanolithography approach, is used to define the pattern of deflector element diameters to be included in a metalens. As described herein, the pattern of deflector element diameters may be repeated one or more times and the pattern of deflector element diameters may be selected to provide a target deflection pattern for optical radiation within a target operational bandwidth.

As illustrated in FIG. 21E, reactive ion etching may be utilized to etch the poly-Si where the resist was not developed. In FIG. 21F, the resist may be removed to reveal the poly-Si pillars (or another shape of deflector element) extending from the fused silica substrate. While the side-view illustrations in FIGS. 21A-E show a one-dimensional row of pillars, it is appreciated that the same processes can be used to fabricate a two-dimensional array of pillars. The fabrication process may be used to fabricate each metalens pixel or metalens subpixel separately, after which the individual metalens pixels or metalens subpixels can be joined together. Alternatively, the fabrication process can be used to fabricate a complete two-dimensional array of metalens pixels or metalens subpixels as a single unit.

According to various embodiments, the metalens pattern comprises a rectangular (e.g., square) array of pillars of varying diameters to correspond to a target reflection pattern. In some instances, a manufacturing approach may limit the maximum size of a rectangular cell with an array of pillars. For example, a tile that is approximately 1 centimeter on each side may be manufactured using a given manufacturing process (e.g., a CMOS process). Any number of these tiles may then be combined to form a metalens with a rectangular aperture having a target length and width. Wherein electron beam lithography is sometimes limited to device manufacturing in the micron or possibly millimeter scale, repetitive tiling of the same pillar diameter array allow for much larger devices to be manufactured by combining adjacent tiles.

For example, an array of pillars may be defined with varying diameters to fit within an aperture in the micron or millimeter scale. The pattern may be repeated as many times as necessary during manufacturing to generate a device that is much larger. For example, a CMOS process may be used up to generate a metalens that is approximately 1.2 square centimeters. A 300-millimeter wafer may be used in a CMOS process to generate a plurality of individual metalenses that are rectangular and vary in size up to approximately one square centimeter. A metalens manufactured using CMOS manufacturing techniques may be sized appropriately for use in smaller electronics, such as mobile phones, computers, personal electronic devices, cameras, etc.

In contrast, deep ultraviolet lithography may be used to generate a metalens on the entire surface of a 300-millimeter wafer. Again, square tiles that are very small (e.g., micron or millimeters scale) may be replicated as many times as needed using the deep ultraviolet lithography process to generate a rectangular metalens on the surface of the silicon wafer. Display optics for a satellite or other imaging device may use a relatively large metalens manufactured using deep ultraviolet lithography techniques.

In still other embodiments, the tiles may be replicated in a nanoimprint lithography process to generate a metalens that is one or more square meters (e.g., for digital display applications or large optical imaging applications). Nanoimprint lithography processes allow for the replication of a basic tile defining an array of pillars having varying diameters as many times as necessary to generate a metalens having a target length and width. For example, a metalens may be manufactured using nanoimprint lithography directly on top of an RGB display or directly on top of a digital imaging sensor. A metalens manufactured on top of an RGB display may deflect light from each individual LED in a target direction normal to the plane of the display. The metalens may increase the effective brightness of each pixel and reduce crosstalk between the individual red, green, and blue subpixels.

In some embodiments, metalenses associated with the blue subpixels (or other color channel subpixels) may be configured to modify the amount of light scattered in off-angle viewing of the RGB display. For example, blue light may scatter off-angle (e.g., in directions other than normal to the plane of the display) more than the red and green color channels. Accordingly, a viewer of the RGB display may perceive a color shift toward blue spectrum during off angle viewing. Accordingly, the metalenses on the RGB display may be configured to normalize or equalize the amount of light scattered off-angle from each red, green, and blue subpixel.

According to various embodiments, the design of the array of pillars of each metalens is selected for compatibility with a particular manufacturing process. For example, the ratio of the height of each pillar to the diameter (or width) of each pillar may be less than three. CMOS processes can be used to lithographically define and etch features having such aspect ratios. Similarly, polysilicon is generally considered CMOS-compatible, while other materials like titanium dioxide are not used to manufacture the metalens to preserve manufacturing process compatibility.

Figure 22A:
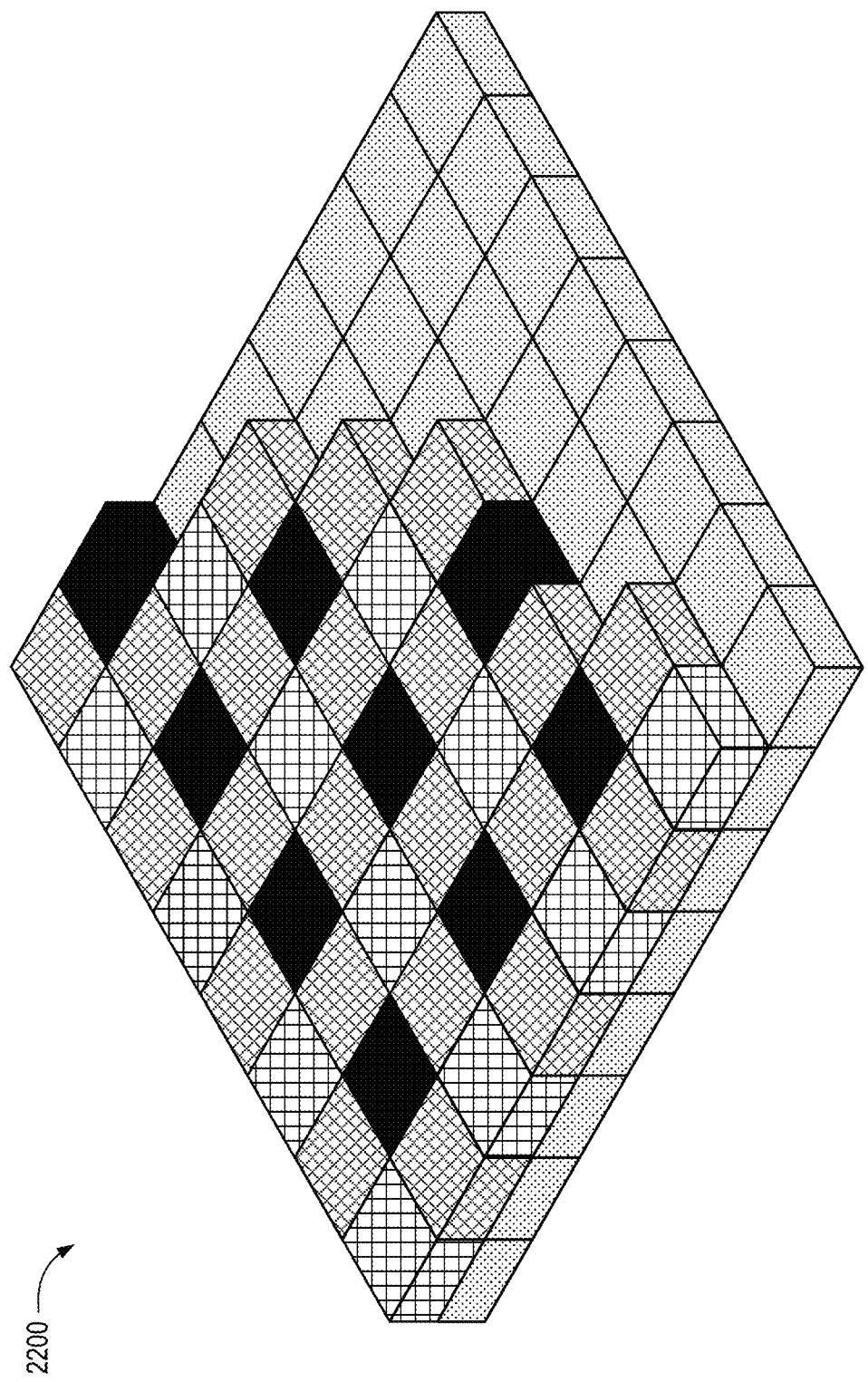
FIG. 22A illustrates an example of a Bayer-type color filter implemented with metalenses overlaid on an imaging sensor, according to one embodiment.

FIG. 22A illustrates an example of a Bayer-type color filter 2200 implemented with metalenses overlaid on an imaging sensor, according to one embodiment. In the illustrated example, the red, green, and blue color filters are illustrated using different shadings. In some embodiments, the metalenses described herein may leverage the existing color filters (such as a Bayer-type color filter) of digital imaging sensors. For example, discrete metalenses with green frequency responses may be mapped to focus optical radiation on green subpixel color filters of an existing color filter array on a digital imaging sensor. Similarly, metalenses with red and blue frequency responses can be mapped to focus or otherwise direct optical radiation to the red and blue subpixel color filters of an existing color filter array on a digital imaging sensor or LED display, respectively.

Figure 22B:
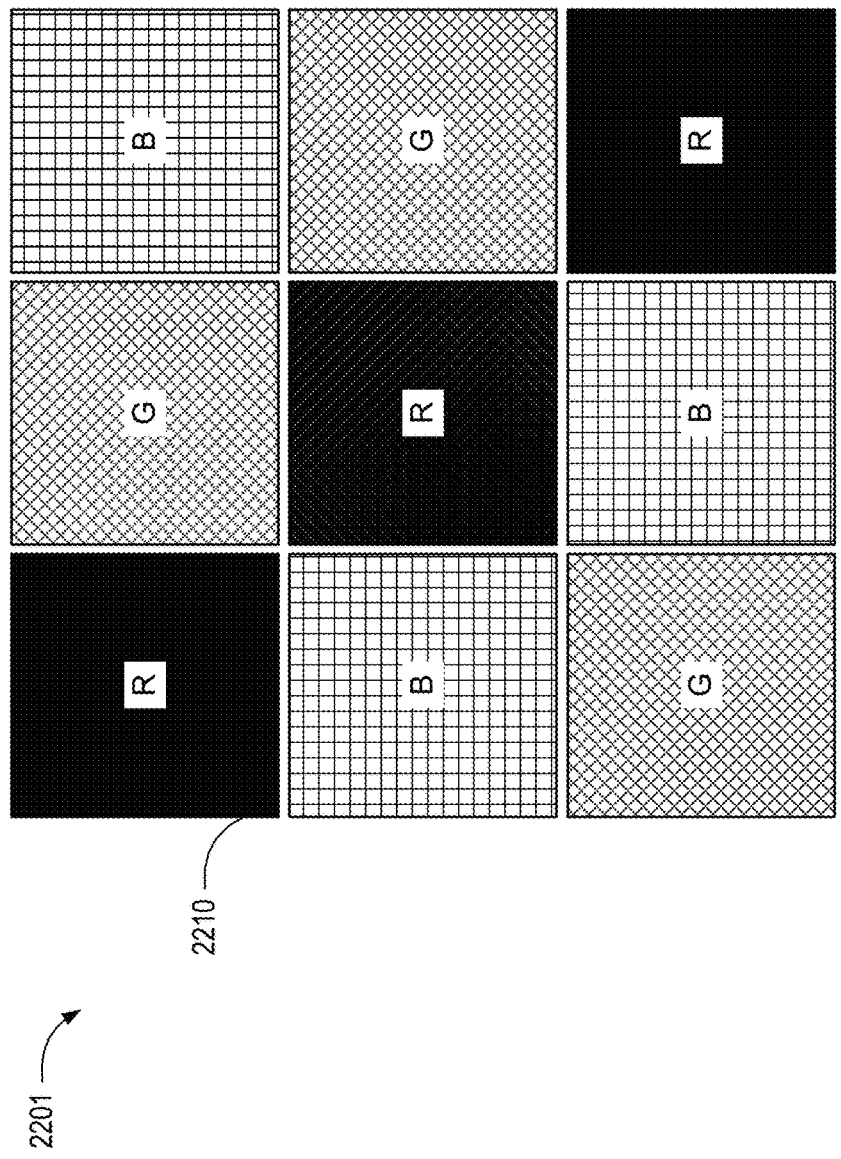
FIG. 22B illustrates an example of a narrow-band pixel mapping color filter implemented with metalenses, according to one embodiment.

FIG. 22B illustrates an example of a narrow-band pixel mapping color filter 2201 implemented with metalenses, according to one embodiment. A metalens or array of metalenses may be utilized in conjunction with a digital imaging sensor that does not have a traditional color filter array. In the illustrated embodiment, red, green, and blue pixel mappings of metalenses are used in a one-to-one mapping to underlying subpixel detectors of a digital imaging sensor.

For instance, each one of the three red metalenses (black) is mapped to a corresponding underlying red subpixel detector element of a digital imaging sensor. Similarly, each of the three green metalenses (diagonal cross-hatching) is mapped to a distinct green subpixel detector element of a digital imaging sensor, and each of the three blue metalenses (vertical and horizontal cross-hatching) is mapped to a distinct blue subpixel detector element of a digital imaging sensor. The effective bandwidth (e.g., 3 Db bandwidth of each metalens may be in the range of 50-80 nanometers. Accordingly, a red metalens centered on 650 nanometers may transmit optical radiation between, for example, 625 nanometers and 675 nanometers. Each of the green and blue metalenses centered on, for example, 535 and 490 nanometers, respectively, may transmit a similar bandwidth of optical radiation to the underlying subpixel detector elements of the digital imaging sensor.

Figure 23:
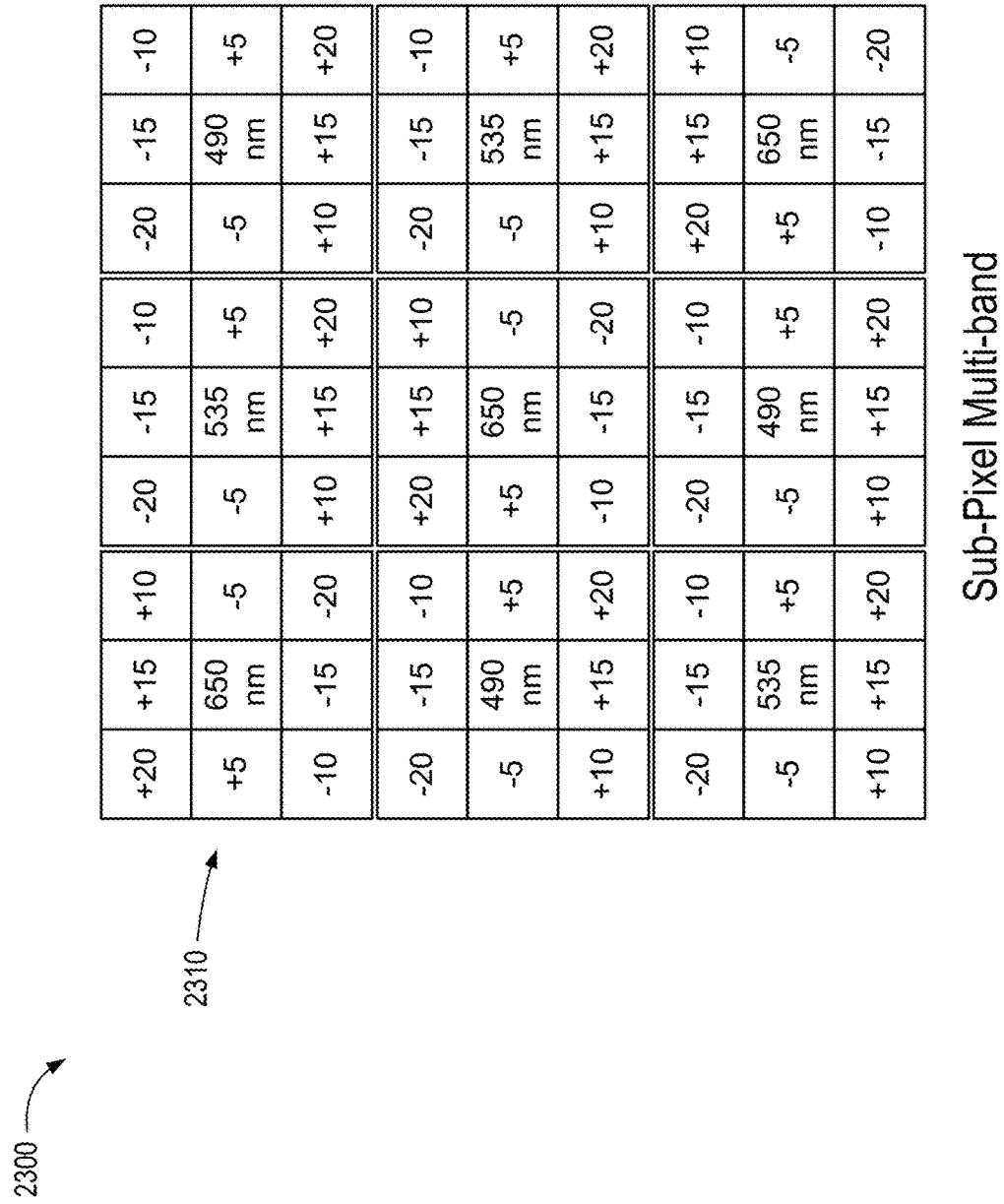
FIG. 23 illustrates an example of a subpixel multiband color filter implemented with metalenses, according to one embodiment.

FIG. 23 illustrates an example of a subpixel multiband color filter 2300 implemented with metalenses, according to one embodiment. In the subpixel multiband color filter 2300, each metalens from FIG. 22B has been replaced with an array of nine subpixel metalenses. The underlying digital imaging sensor may still only include nine subpixel detector elements. As such, each array of nine subpixel metalenses directs optical radiation onto a single subpixel detector element of the digital imaging sensor.

For example, the red metalens 2210 of FIG. 22B is replaced with an array of nine subpixel metalenses 2310. The center subpixel metalens shows a centered operational bandwidth of 650 nanometers. The surrounding eight subpixel metalenses have operational bandwidths centered on wavelengths offset from the center subpixel metalens by −20, −15, −10, −5, +5, +10, +15, and +20 nanometers, as illustrated. Collectively, the array of nine-subpixel metalenses 2310 transmits a wider bandwidth of optical radiation to the underlying subpixel detector element of the digital imaging sensor than would be possible using a single metalens (as in FIG. 23). Using the example effective operational bandwidth of 50 nanometers above, the illustrated nine subpixel metalenses 2310 may transmit optical radiation between 605 and 695 to the underlying subpixel detector element of the digital imaging sensor.

It is appreciated each metalens of FIG. 23 may be replaced with an array of N subpixel metalenses, where N is an integer value greater than 2. The tuning frequency offset of each of the subpixel metalenses may be selected to achieve a target collective operational bandwidth.

Figure 24:
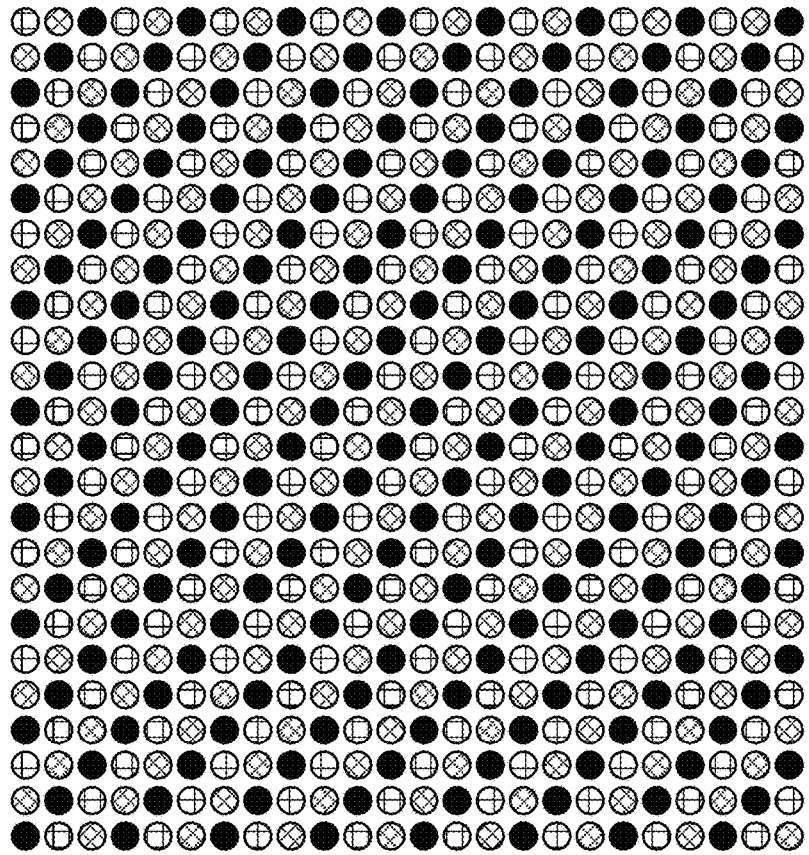
FIG. 24 illustrates a subwavelength multiband color filter implemented with metalenses, according to one embodiment.
Figure 25:
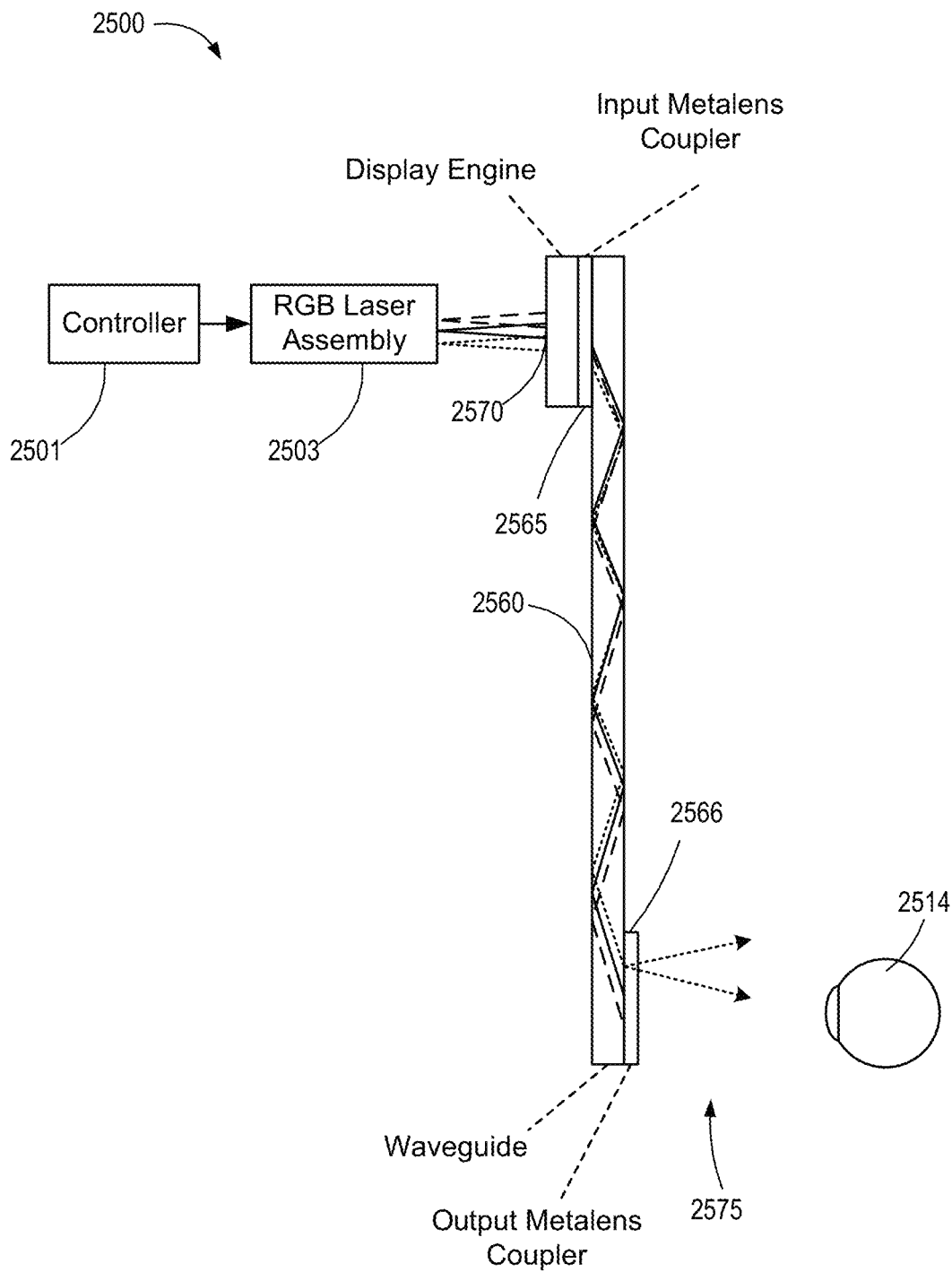
FIG. 25 illustrates an example display system that utilizes input and output metalenses in conjunction with a waveguide, according to one embodiment.

FIG. 24 illustrates a subwavelength multiband color filter 2400 implemented with metalenses, according to one embodiment. As illustrated, the subwavelength multiband color filter 2400 includes metalens filters for red, green, and blue that are subwavelength in size. As described in conjunction with FIGS. 9A-9C, the subwavelength multiband color filter 2400 may effectively operate as a two-dimensional array of flat prisms that direct red, green, and blue optical radiation to the corresponding subpixel detector element of an underlying digital imaging sensor FIG. 25 illustrates an example display system 2500 that utilizes an input metalens coupler 2565 and an output metalens coupler 2566 in conjunction with a waveguide 2560, according to one embodiment. As illustrated, controller 2501 and an RGB laser assembly 2503 transmit optical radiation to a display engine 2570 that generates an RGB display. The input metalens coupler 2565 couples the generated RGB optical radiation for transmission along the length of the waveguide 2560. The output metalens coupler 2566 receives the transmitted optical radiation and decouples it from the waveguide 2560 for visualization by a user's eye 2514 (e.g., via frequency selective focusing to a target plane).

This disclosure has been made with reference to various embodiments, including the best mode. However, those skilled in the art will recognize that changes and modifications may be made to the various embodiments without departing from the scope of the present disclosure. While the principles of this disclosure have been shown in various embodiments, many modifications of structure, arrangements, proportions, elements, materials, and components may be adapted for a specific environment and/or operating requirements without departing from the principles and scope of this disclosure. These and other changes or modifications are intended to be included within the scope of the present disclosure.

This disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element.

What is claimed is:

1. An imaging system, comprising:
   a multipixel digital imaging sensor with a plurality of subpixels, including at least:
      a first set of subpixels to detect a first band of optical radiation,
      a second set of subpixels to detect a second band of optical radiation, and
      a third set of subpixels to detect a third band of optical radiation; and
   a metalens filter layer comprising a plurality of subwavelength deflector elements that extend from a substrate with a repeating periodic pattern of a spatially multiplexed set of frequency-specific deflector elements that have different diameters and constant interelement on-center spacings for each of the first, second, and third bands of optical radiation, and wherein the diameters and interelement on-center spacings are selected to cause the metalens filter layer to:
      receive optical radiation that includes optical radiation in each of the first, second and third bands,
      direct optical radiation in the first band to the first set of subpixels,
      direct optical radiation in the second band to the second set of subpixels, and
      direct optical radiation in the third band to the third set of subpixels,
   wherein each subwavelength deflector element has a height and a width that are each less than a smallest wavelength in the first, second, and third bands of optical radiation.

2. The system of claim 1, wherein the multipixel digital imaging sensor comprises a red, green, blue (RGB) digital image sensor,
   wherein the first band of optical radiation comprises red, the second band of optical radiation comprises green, and the third band of optical radiation comprises blue.

3. An optical metalens prism, comprising:
   a first array of passive deflector elements with varying diameters that extend from a substrate with a first repeating pattern of deflector element diameters to direct received optical radiation having a first wavelength in a first direction;

a second array of passive deflector elements with varying diameters that extend from the substrate with a second repeating pattern of deflector element diameters to direct received optical radiation having a second wavelength in a second direction; and a third array of passive deflector elements with varying diameters that extend from the substrate with a third repeating pattern of deflector element diameters to direct received optical radiation having a third wavelength in a third direction, wherein the passive deflector elements of each of the first, second, and third arrays are in-plane, spatially multiplexed, and intermingled with one another on the substrate, wherein interelement on-center spacings of the passive deflector elements of each of the first, second, and third arrays are selected as a function of first, second, and third wavelengths, respectively, and wherein each passive deflector element has a height and a width that are each less than a smallest of the first, second, and third wavelengths.

4. The optical metalens prism of claim 3, wherein each passive deflector element is polarization independent.

5. A multiband metalens filter, comprising:
a first plurality of passive deflector elements with varying diameters direct a subset of wavelengths within a first bandwidth to a first detector element; and
a second plurality of passive deflector elements with varying diameters to direct a subset of wavelengths within a second bandwidth to a second detector element,
wherein the first plurality of passive deflector elements and the second plurality of passive deflector elements are interleaved on a common substrate.

6. The filter of claim 5, further comprising:
a third plurality of passive deflector elements with varying diameters to a subset of wavelengths within a third bandwidth to a third detector element,
wherein the third plurality of passive deflector elements is interleaved on the common substrate together with the first plurality of passive deflector elements and the second plurality of passive deflector elements.

7. The filter of claim 5, wherein each of the first, second, and third bandwidths is at least 100 nanometers wide.

8. An optical focusing system, comprising:
a double-let metalens with only two metalens elements, including:
a first metalens element with a first field of view to:
receive optical radiation at angles less than an acceptance angle, and
deflect the received optical radiation according to a phase-shift deflection pattern; and
a second metalens element with a second field of view to focus the deflected optical radiation from the first metalens onto a focal plane,
wherein the double-let metalens, with only two metalens elements, is configured to preserve angular information of the received optical radiation to reconstruct an image onto the focal plane via simultaneous control of a slope of the phase shift and intercept of the phase shift of deflected optical radiation.

9. The optical focusing system of claim 8, wherein the first metalens element and the second metalens element function to simultaneously correct chromatic and geometric aberrations within a broad spectral bandwidth and angular response.

10. The optical focusing system of claim 8, wherein a phase profile output of the first metalens element is used as an input phase profile to the second metalens.

11. The optical focusing system of claim 8, further comprising a rectangular imaging sensor positioned at the focal plane.

12. The optical focusing system of claim 11, wherein the first metalens element is rectangular.

13. The optical focusing system of claim 12, wherein the second metalens element is rectangular.

14. The optical focusing system of claim 8, wherein the first metalens element comprises a first plurality of passive deflector elements extending from a surface of a first substrate, and wherein the second metalens element comprises a second plurality of passive deflector elements extending from a surface of a second substrate, and wherein an optically transmissive bulk material connects the first metalens element and the second metalens element.

15. The optical focusing system of claim 14, wherein the optically transmissive bulk material is silicon-based.

16. The optical focusing system of claim 8, wherein each of the first metalens element and second metalens element comprises a plurality of passive deflector elements with varying diameters that are interleaved with one another and extend from a common substrate with a repeating pattern of deflector element diameters,
wherein interelement on-center spacings of the passive deflector elements are selected as a function of an operational wavelength of, and
wherein each passive deflector element has a height and a width that are each less than a smallest wavelength within an operational bandwidth of the optical focusing system.

17. The optical focusing system of claim 16, wherein the passive deflector elements are polarization-independent.

* * * * *